(12) United States Patent
Oh et al.

(10) Patent No.: US 11,800,772 B2
(45) Date of Patent: Oct. 24, 2023

(54) DISPLAY APPARATUS

(71) Applicant: SAMSUNG DISPLAY CO., LTD., Yongin-si (KR)

(72) Inventors: Keunchan Oh, Yongin-si (KR); Jangsoo Kim, Yongin-si (KR); Jaecheol Park, Yongin-si (KR); Gakseok Lee, Yongin-si (KR); Sunkyu Joo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 280 days.

(21) Appl. No.: 17/167,370

(22) Filed: Feb. 4, 2021

(65) Prior Publication Data
US 2021/0249478 A1 Aug. 12, 2021

(30) Foreign Application Priority Data
Feb. 7, 2020 (KR) .................. 10-2020-0015207

(51) Int. Cl.
*H10K 59/38* (2023.01)
*H10K 59/12* (2023.01)

(52) U.S. Cl.
CPC ............. *H10K 59/38* (2023.02); *H10K 59/12* (2023.02)

(58) Field of Classification Search
CPC ............... H01L 27/322; H01L 27/3244; H01L 27/3218; H01L 27/3246; H01L 51/5284; H01L 2251/5369; G02F 1/133514; G02F 1/01791; G02F 1/133512
See application file for complete search history.

(56) References Cited

U.S. PATENT DOCUMENTS

| 8,304,265 | B2 | 11/2012 | Nakamura et al. |
| 9,989,806 | B2 | 6/2018 | Lee et al. |
| 2019/0013363 | A1 | 1/2019 | Joo et al. |
| 2021/0320150 | A1* | 10/2021 | Yang ................ H01L 27/3223 |

FOREIGN PATENT DOCUMENTS

| KR | 101391326 B1 | 5/2014 |
| KR | 1020170031613 A | 3/2017 |
| KR | 1020190004874 A | 1/2019 |

* cited by examiner

*Primary Examiner* — Anne M Hines
*Assistant Examiner* — Jose M Diaz
(74) *Attorney, Agent, or Firm* — CANTOR COLBURN LLP

(57) ABSTRACT

A display apparatus for providing an image through an array of a plurality of pixels includes: an optical panel which converts light of the light-emitting panel into light of another color or transmit the light of the light-emitting panel. The optical panel includes: a substrate; a plurality of color filters arranged over the substrate; a first light-blocking layer arranged in the non-pixel area; a second light-blocking layer arranged in the non-pixel area and on the first light-blocking layer; and a color-converting layer and a transmission layer each overlapping a corresponding color filter from among the plurality of color filters in a plan view. Each of the first light-blocking layer and the second light-blocking layer defines a plurality of holes corresponding to the plurality of pixels, and a width of a hole of the second light-blocking layer is greater than a width of a hole of the first light-blocking layer.

20 Claims, 21 Drawing Sheets

DISPLAY APPARATUS

This application claims priority to Korean Patent Application No. 10-2020-0015207, filed on Feb. 7, 2020, and all the benefits accruing therefrom under 35 U.S.C. § 119, the content of which in its entirety is herein incorporated by reference.

BACKGROUND

1. Field

One or more embodiments relate to a display apparatus including an optical panel.

2. Description of Related Art

As various kinds of electronic apparatuses such as mobile phones, personal digital assistants ("PDA"), computers, and large-scale televisions have been developed, various kinds of display apparatuses applicable thereto are under development. A display apparatus widely in use in the market may include a liquid crystal display apparatus including a backlight unit.

The liquid crystal display apparatus uses light of a backlight unit without spontaneously emitting light and also uses a color filter to reproduce colors. While white light emitted from a backlight light source passes red, green, and blue color filters, light efficiency is low because the amount of light is reduced by about ⅓ by each color filter.

SUMMARY

As a display apparatus emitting light of different colors for pixel areas, a display apparatus including an organic light-emitting diode and a quantum-dot color conversion layer ("QD-CCL") has been developed. A quantum dot is excited by incident light and emits light having a longer wavelength than the incident light. Light in a low wavelength band may be used as incident light of the QD-CCL to provide a high-quality image having excellent color reproduction and high brightness.

One or more embodiments include a display apparatus which may provide a high-quality image and prevent or reduce staining due to a process error during a process of manufacturing the display apparatus.

Additional aspects will be set forth in part in the description which follows and, in part, will be apparent from the description, or may be learned by practice of the presented embodiments of the disclosure.

According to one or more embodiments, a display apparatus for providing an image through an array of a plurality of pixels apart from each other with a non-pixel area therebetween, includes: a light-emitting panel which emits light of a single color, and an optical panel which converts the light emitted from the light-emitting panel into light of another color or transmit the light of the light-emitting panel, where the optical panel includes: a substrate; a plurality of color filters arranged over the substrate; a first light-blocking layer arranged in the non-pixel area, a second light-blocking layer arranged in the non-pixel area and arranged on the first light-blocking layer; and a color-converting layer and a transmission layer each overlapping a corresponding color filter among the plurality of color filters in a plan view, and each of the first light-blocking layer and the second light-blocking layer defines a plurality of holes corresponding to the plurality of pixels, and a width of a hole of the second light-blocking layer among the plurality of holes is greater than a width of a hole of the first light-blocking layer among the plurality of holes.

The plurality of color filters may include a first color filter, a second color filter, and a third color filter each having different colors from each other.

Two or more color filters of the first to third color filters may extend to the non-pixel area, and extension portions of the two or more color filters may be arranged between the substrate and the first light-blocking layer.

The second light-blocking layer may directly contact the first light-blocking layer, and a stack body including the first light-blocking layer and the second light-blocking layer may surround each of the plurality of pixels in the plan view.

The color-converting layer may be apart from the transmission layer with respect to the stack body in the plan view.

The color-converting layer may contact the transmission layer on the stack body.

The plurality of color filters may include a first color filter overlapping the transmission layer in the plan view, a second color filter having a color different from the first color filter, and a third color filter having a color different from each of the first color filter and the second color filter, the second color filter may define a first hole overlapping the transmission layer and a portion of the first color filter in the plan view, and the first hole may overlap a second hole of the plurality of holes of the first light-blocking layer.

A width of the second hole may be less than a width of the first hole.

The first color filter may define a third hole overlapping a portion of the second color filter in the plan view, the third hole may overlap a fourth hole of the plurality of holes of the first light-blocking layer in the plan view, and a width of the fourth hole may be greater than a width of the third hole.

The light-emitting panel may include an organic light-emitting diode.

According to one or more embodiments, a display apparatus for providing an image through an array of a plurality of pixels including a first pixel, a second pixel, and a third pixel apart from one another with a non-pixel area therebetween, includes a light-emitting panel including a light-emitting diode, and an optical panel arranged on the light-emitting panel, where the optical panel includes: a substrate; a filter layer arranged on the substrate and including a first color filter, a second color filter, and a third color filter corresponding to the first pixel, the second pixel, and the third pixel, respectively; a stack body arranged in the non-pixel area and including a first light-blocking layer and a second light-blocking layer; and a color-converting layer and a transmission layer each arranged in a corresponding pixel of the first to third pixels, where each of the first light-blocking layer and the second light-blocking layer defines a plurality of holes corresponding to the plurality of pixels, and a width of a hole of the second light-blocking layer among the plurality of holes is different from a width of a hole of the first light-blocking layer among the plurality of holes.

Each of the first light-blocking layer and the second light-blocking layer may include a material having a color different from colors of the first to third color filters.

The stack body may include a first portion and a second portion, the second portion is farther from the substrate than the first portion and a width of the first portion may be greater than a width of the second portion.

The first portion may include the first light-blocking layer, and the second portion may include the second light-blocking layer.

Two or more color filters of the first to third color filters may extend to the non-pixel area, and extension portions of the two or more color filters may be arranged between the substrate and the stack body.

The color-converting layer may be apart from the transmission layer with respect to the stack body in a plan view.

The color-converting layer may contact the transmission layer on the stack body.

The first color filter may overlap the transmission layer in the first pixel, the second color filter may define a first hole located in the first pixel, the first hole may overlap a second hole of the plurality of holes of the first light-blocking layer, and a width of the second hole may be less than a width of the first hole.

The color-converting layer may include a first color-converting layer including first quantum dots, and a second color-converting layer including second quantum dots, the second color filter may overlap the first color-converting layer in the second pixel in a plan view, the first color filter may define a third hole located in the second pixel, the third hole may overlap a fourth hole of the plurality of holes of the first light-blocking layer, and a width of the fourth hole may be greater than a width of the third hole.

The first quantum dot may include the same material as the second quantum dot and have a size different from the second quantum dot.

The light-emitting panel may include an organic light-emitting diode.

These and/or other aspects will become apparent and more readily appreciated from the following description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
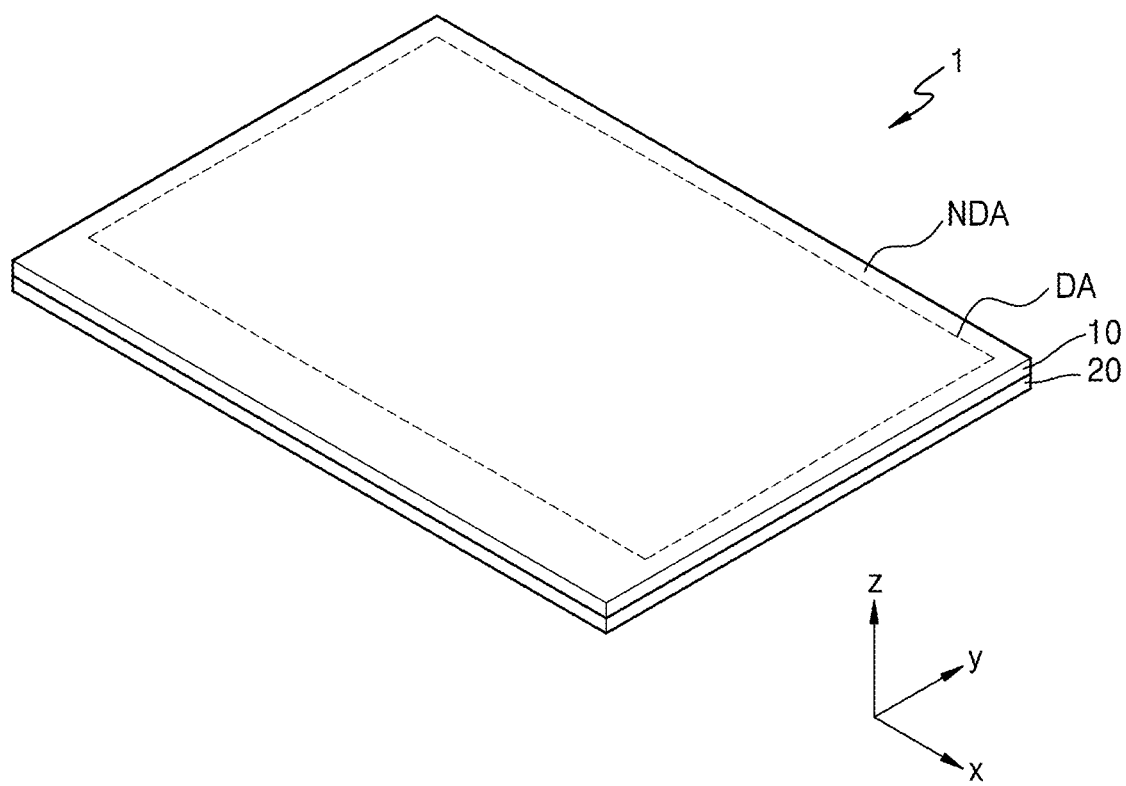
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, particular embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations are omitted.

It will be understood that although the terms "first", "second", etc. may be used herein to describe various components, these components should not be limited by these terms. These components are only used to distinguish one component from another.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, area, or element, it can be directly or indirectly formed on the other layer, region, or element. That is, for example, intervening layers, regions, or elements may be present.

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being connected to another layer, region, or component, it can be directly or indirectly connected to the other layer, region, or component. That is, for example, intervening layers, regions, or components may be present. As an example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

FIG. 1 is a perspective view of a display apparatus 1 according to an embodiment.

Referring to FIG. 1, the display apparatus 1 includes a display area DA and a non-display area NDA. The display area DA emits light, and the non-display area NDA does not emit light. The display apparatus 1 may display a preset image by using light emitted from a plurality of pixels arranged in the display area DA.

The non-display area NDA neighbors the display area DA and may entirely surround the display area DA. In an embodiment, the display area DA may have a rectangular shape having a long length in a ±x direction (i.e., longitudinal direction) and a short length in a ±y direction (i.e., latitudinal direction). Alternatively, the display area DA may have a rectangular shape having a long length in a ±y direction, a square shape, or a polygonal shape.

The display apparatus 1 may include a light-emitting panel 20 and an optical panel 10 stacked in a thickness direction (a z-direction) of the display apparatus 1.

Figure 2A:
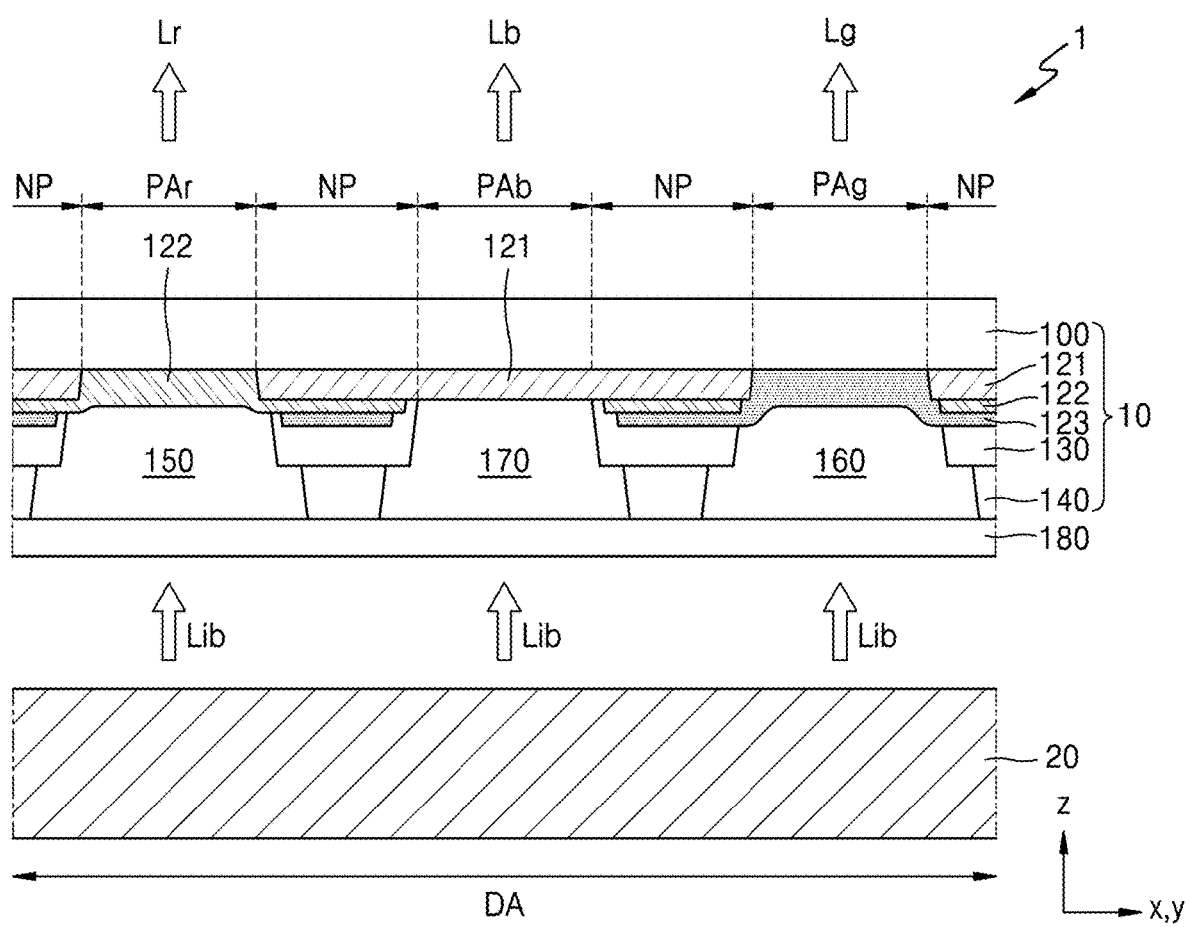
FIG. 2A is a cross-sectional view of a display apparatus according to an embodiment.

FIG. 2A is a cross-sectional view of the display apparatus 1 according to an embodiment. The cross-sectional view of FIG. 2A corresponds to a cross-sectional view of a portion corresponding to the display area DA of the display apparatus 1 described with reference to FIG. 1.

Referring to FIG. 2A, the display apparatus 1 may include a red pixel PAr, a blue pixel PAb, and a green pixel PAg emitting red light Lr, blue light Lb, and green light Lg, respectively. The display apparatus 1 may display an image by using light emitted from red pixels PAr, blue pixels PAb, and green pixels PAg.

The light-emitting panel 20 may emit light toward the optical panel 10. Light emitted from the light-emitting panel 20 is light Lib incident to the optical panel 10. The optical panel 10 may convert or transmit the incident light Lib. Therefore, red light Lr, blue light Lb, or green light Lg may be emitted from the optical panel 10. The incident light Lib is light in a specific wavelength band and may be blue light.

As shown in FIG. 2A, the optical panel 10 may include a first substrate 100, first to third color filters 121, 122, and 123, a first light-blocking layer 130, a second light-blocking layer 140, first and second color-converting layers 150 and 160, and a transmission layer 170.

The first substrate 100 is a transparent substrate and may include a transparent glass material or a transparent resin material. The first substrate 100 may include a transparent glass substrate having silicon dioxide ("$SiO_2$") as a main component. In another embodiment, the first substrate 100 may include a polymer resin. The polymer resin may include polyethersulfone, polyacrylate, polyetherimide, polyethylene naphthalate, polyethylene terephthalate, polyphenylene sulfide, polyarylate, polyimide, polycarbonate, cellulose triacetate, and/or cellulose acetate propionate.

The first to third color filters 121, 122, and 123 may include an organic material including dye or pigment. The first color filter 121 may include a photosensitive material including a first color, for example, blue pigment or dye. The second color filter 122 may include a photosensitive material including a second color, for example, red pigment or dye. The third color filter 123 may include a photosensitive material including a third color, for example, green pigment or dye.

The first to third color filters 121, 122, and 123 may be arranged to correspond to corresponding pixels, respectively. The first color filter 121 may be arranged in a first region of a first substrate 100 corresponding to a first pixel, for example, a region marked as blue pixel PAb in FIG. 2A, the second color filter 122 may be arranged in a second region of the first substrate 100 corresponding to a second pixel, for example, a region marked as red pixel PAr in FIG. 2A, and the third color filter 123 may be arranged in a third region of the first substrate 100 corresponding to a third pixel, for example, a region marked as green pixel PAg in FIG. 2A.

The first color filter 121 may be arranged in not only the first region of the first substrate 100 corresponding to the blue pixel PAb, but also in a region of the first substrate 100 corresponding to a non-pixel area NP between pixels. Similar to the first color filter 121, the second color filter 122 and/or the third color filter 123 may be arranged in not only a region of the first substrate 100 corresponding to the relevant pixel, but also in the non-pixel area NP between pixels. A specific structure of the first to third color filters 121, 122, and 123 arranged in the non-pixel area NP is described below in a relevant section.

The first light-blocking layer 130 and the second light-blocking layer 140 may be arranged in the non-pixel area NP. The first light-blocking layer 130 and the second light-blocking layer 140 may not directly contact the first substrate 100. As an example, a portion of the first color filter 121, and a portion of the second color filter 122 and/or the third color filter 123 may be arranged between the first substrate 100 and the first light-blocking layer 130

The first light-blocking layer 130 and the second light-blocking layer 140 may include a colored material. As an example, the first light-blocking layer 130 and the second light-blocking layer 140 may include a black material or a white material. In an embodiment, the first light-blocking layer 130 and the second light-blocking layer 140 may have the same color. As an example, the first light-blocking layer 130 and the second light-blocking layer 140 may include the same black material. In another embodiment, one of the first light-blocking layer 130 and the second light-blocking layer 140 may include a white material, and the other may include a black material.

The first light-blocking layer 130 and the second light-blocking layer 140 may include an opaque colored inorganic insulating material such as chrome oxide or molybdenum oxide, or include an opaque colored organic insulating material such as a black resin or a white resin.

The first light-blocking layer 130 and the second light-blocking layer 140 may overlap each other in the non-pixel area NP in the z-direction. A stack body of the first light-blocking layer 130 and the second light-blocking layer 140 may have a shape surrounding each of the first to third pixels, for example, the blue pixel PAb, the red pixel PAr, and the green pixel PAg. A stack body of the first light-blocking layer 130 and the second light-blocking layer 140 may correspond to a kind of partition wall surrounding the respective pixels. As an example, the first light-blocking layer 130 and the second light-blocking layer 140 may correspond to a first partition wall and a second partition wall, respectively. The first light-blocking layer 130 and the second light-blocking layer 140 may each define holes corresponding to the first to third pixels, respectively. A hole of the second light-blocking layer 140 may be different from a hole of the first light-blocking layer 130. As an example, a hole of the second light-blocking layer 140 may be greater than a hole of the first light-blocking layer 130. In a stack structure of the first light-blocking layer 130 and the second light-blocking layer 140, that is, the partition wall, a width of a portion (e.g., the first light-blocking layer) of the partition wall that is close to the first substrate 100 in an x,y direction may be greater than a width of a portion (e.g., the second light-blocking layer) that is away from the first substrate 100. Here, x,y direction means a certain direction in a plane defined by the x-direction and y-direction.

A color-converting layer or a transmission layer may be arranged in each pixel. In an embodiment, it is shown in FIG. 2A that the first color-converting layer 150, the second color-converting layer 160, and the transmission layer 170 may be arranged to correspond to the red pixel PAr, the green pixel PAg, and the blue pixel PAb, respectively.

The first color-converting layer 150 may be arranged on the second color filter 122 such that the second color filter 122 is arranged between the first substrate 100 and the first color-converting layer 150. The first color-converting layer 150 may convert incident light Lib to light having a preset color, for example, red light Lr. The first color-converting layer 150 may include first quantum dots that are excited by incident light Lib to emit light of a color (e.g., red light Lr) having a wavelength longer than a wavelength of the incident light Lib.

The second color-converting layer 160 may be arranged on the third color filter 123 such that the third color filter 123 is arranged between the first substrate 100 and the second color-converting layer 160. The second color-converting layer 160 may convert incident light Lib to light having a preset color, for example, green light Lg. The second color-converting layer 160 may include second quantum dots that are excited by incident light Lib to emit light of a color (e.g., green light Lg) having a wavelength longer than a wavelength of the incident light Lib.

The transmission layer 170 may be arranged on the first color filter 121 such that the first color filter 121 is arranged between the first substrate 100 and the transmission layer 170. The transmission layer 170 may transmit incident light Lib without conversion of the wavelength of the incident light Lib.

A barrier layer 180 may be commonly arranged on the first color-converting layer 150, the second color-converting layer 160, and the transmission layer 170. The barrier layer 180 may include an inorganic insulating material, for example, silicon nitride, silicon oxide, or silicon oxynitride. Alternatively, the barrier layer 180 may include an organic insulating material such as a resin, and the above-mentioned organic insulating material may be transparent. In an embodiment, the barrier layer 180 may include a single layered or multi-layered structure including at least one of the inorganic insulating material or the organic insulating material. In another embodiment, the barrier layer 180 may be omitted.

Figure 2B:
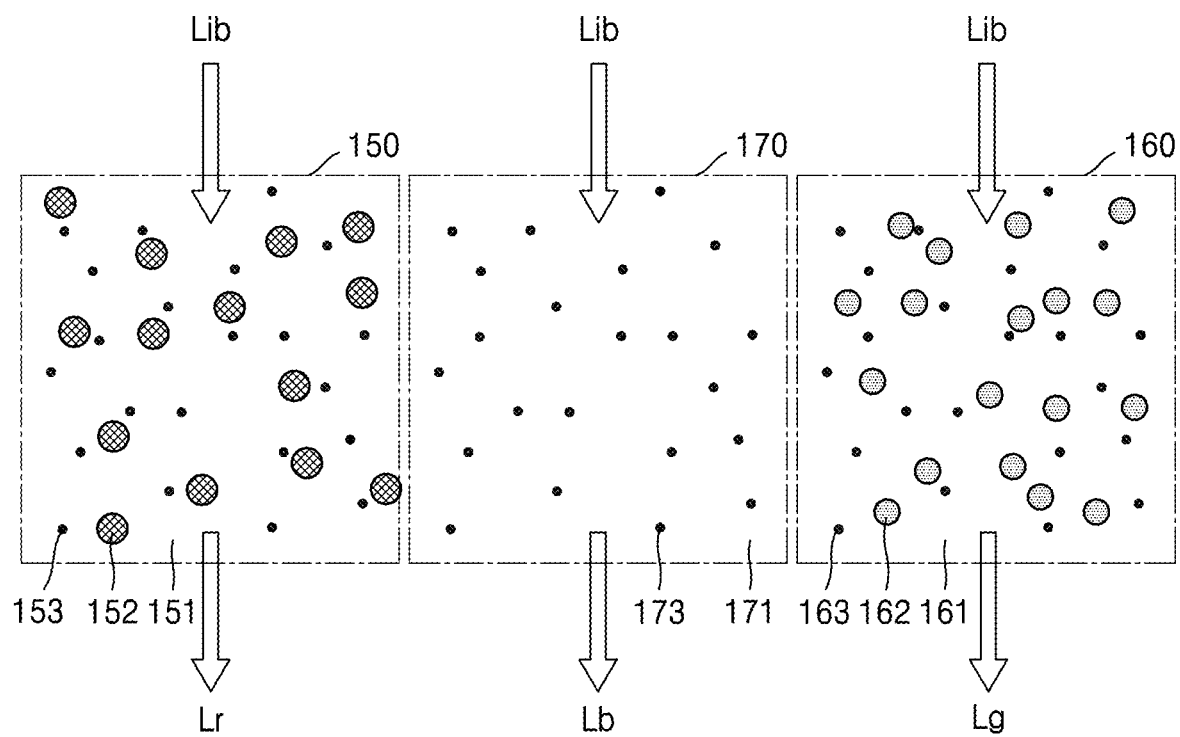
FIG. 2B is an enlarged view of portions of a first color-converting layer, a second color-converting layer, and a transmission layer of FIG. 2A according to an embodiment.

FIG. 2B is an enlarged view of portions of the first color-converting layer, the second color-converting layer, and the transmission layer of FIG. 2A.

Referring to FIG. 2B, the first color-converting layer 150 may convert blue incident light Lib to red light Lr. The first color-converting layer 150 may include a first polymer 151 in which first quantum dots 152 and first scattering particles 153 are dispersed. The first polymer 151 may include an organic material having a light transmissive characteristic. In an embodiment, the first polymer 151 may include a photosensitive polymer.

The first quantum dots 152 may be excited by blue incident light Lib to emit red light having a wavelength longer than a wavelength of the blue incident light Lib radially. The first scattering particles 153 may scatter the blue incident light Lib that is not absorbed by the first quantum dots 152 to allow more first quantum dots 152 to be excited by the scattered incident light 152, thereby increasing a color-converting rate of the first color-converting layer 150. The first scattering particles 153 may include, for example, titanium oxide ($TiO_2$) or metal particles. The first quantum dots 152 may include one of Group II-VI compound, Group III-V compound, Group IV-VI compound, Group IV element, Group IV compound, or a combination thereof.

The second color-converting layer 160 may convert the blue incident light Lib to green light Lg. The second color-converting layer 160 may include a second polymer 161 in which second quantum dots 162 and second scattering particles 163 are dispersed. The second polymer 161 may include an organic material having a light transmissive characteristic. In an embodiment, the second polymer 161 may include a photosensitive polymer.

The second quantum dots 162 may be excited by blue incident light Lib to emit green light Lg having a wavelength longer than a wavelength of the blue incident light Lib, radially. The second polymer 161 may include the same material as the first polymer 151.

The second scattering particles 163 may scatter blue incident light Lib that is not absorbed by the second quantum dots 162 to allow more second quantum dots 162 to be excited by the scattered incident light 152, thereby increasing a color-converting rate of the second color-converting layer 160. The second scattering particles 163 may include, for example, titanium oxide ($TiO_2$) or metal particles and include the same material as the first scattering particles 153. The second quantum dots 162 may include one of Group II-VI compound, Group III-V compound, Group IV-VI compound, Group IV element, Group IV compound, or a combination thereof. The second quantum dots 162 may include the same material as the first quantum dots 152. In this case, a size of the second quantum dots 162 may be less than a size of the first quantum dots 152.

The transmission layer 170 may transmit blue incident light Lib without wavelength conversion. The transmission layer 170 may include a third polymer 171 in which third scattering particles 173 are dispersed. The third polymer 171 may include, for example, an organic material having a light transmissive characteristic such as a silicon resin and an epoxy resin. In an embodiment, the third polymer 171 may have photosensitivity. The third polymer 171 may include the same material as the first polymer 151 and the second polymer 161. The third scattering particles 173 may scatter and emit blue incident light Lib and include the same material as the first scattering particles 153 and the second scattering particles 163.

Figure 3A:
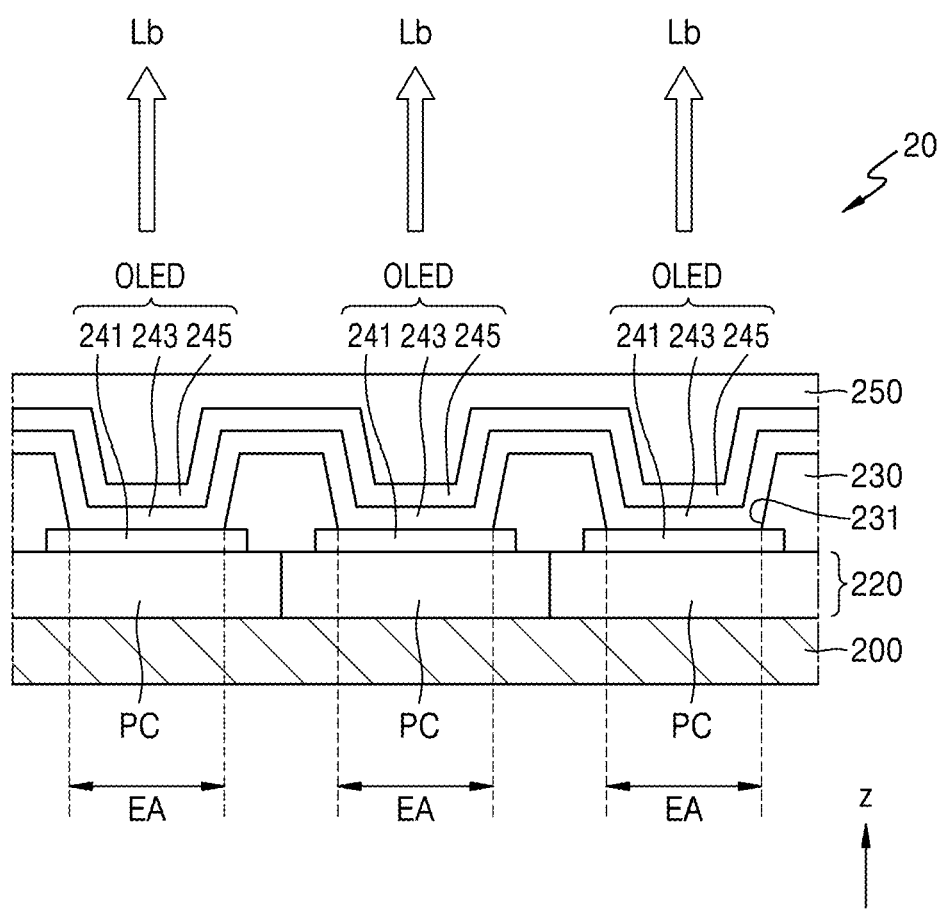
FIG. 3A is a cross-sectional view of a display panel according to an embodiment.

FIG. 3A is a cross-sectional view of a display panel according to an embodiment.

Referring to FIG. 3A, the light-emitting panel 20 may include light-emitting elements, for example, organic light-emitting diodes OLED arranged on a second substrate 200.

The second substrate 200 may include a material such as glass, metal, and an organic material. As an example, the second substrate 200 may include glass having $SiO_2$ as a main component, or various flexible or bendable materials, for example, a polymer resin.

A pixel circuit layer 220 may be arranged between the second substrate 200 and a light-emitting element layer including the organic light-emitting diodes OLED. The pixel circuit layer 220 may include pixel circuits PC. Each pixel circuit PC may be electrically connected to an organic light-emitting diode OLED. Each pixel circuit PC may include a plurality of electronic elements, for example, transistors and at least one capacitor.

An organic light-emitting diode OLED may include a first electrode 241, a second electrode 245 opposite to the first electrode 241, and an intermediate layer 243 between the first electrode 241 and the second electrode 245. The first electrodes 241 may be arranged to be apart from each other to correspond to emission areas EA. The edges of each first electrode 241 may be covered by an insulating layer 230. The insulating layer 230 may define an opening 231 corresponding to the central portion of each first electrode 241. Each first electrode 241 may contact the intermediate layer 243 through the opening 231. The opening may define the emission area EA of the organic light-emitting diode OLED.

The intermediate layer 243 may include an emission layer. The emission layer may include an organic material. As an example, the emission layer may include a low molecular weight organic material or a polymer organic material. The emission layer may include a low molecular weight or polymer organic material that may emit blue light. The intermediate layer 243 may selectively further include at least one of a hole transport layer ("HTL"), a hole injection layer ("HIL"), an electron transport layer ("ETL"), or an electron injection layer ("EIL") in addition to the emission layer. The intermediate layer 243, for example, the emission layer may be provided as one body over the second substrate 200. The at least one functional layer may be provided as one body over the second substrate 200. The second electrode 245 may include a transparent or semi-transparent electrode.

An encapsulation layer 250 may be arranged over the second substrate 200 to cover the organic light-emitting diodes OLED. The encapsulation layer 250 may include at least one inorganic encapsulation layer and at least one organic encapsulation layer. In an embodiment, the encapsulation layer 250 may include a structure in which a first inorganic encapsulation layer/an organic encapsulation layer/a second inorganic encapsulation layer are sequentially stacked. Alternatively, the encapsulation layer 250 may include a glass substrate. In an embodiment, the encapsulation layer 250 may be omitted.

The organic light-emitting diode OLED may emit blue light Lb through each emission area EA. The blue light Lb emitted from the organic light-emitting diode OLED is the light Lib incident to the optical panel 10 described above with reference to FIGS. 2A and 2B.

Figure 3B:
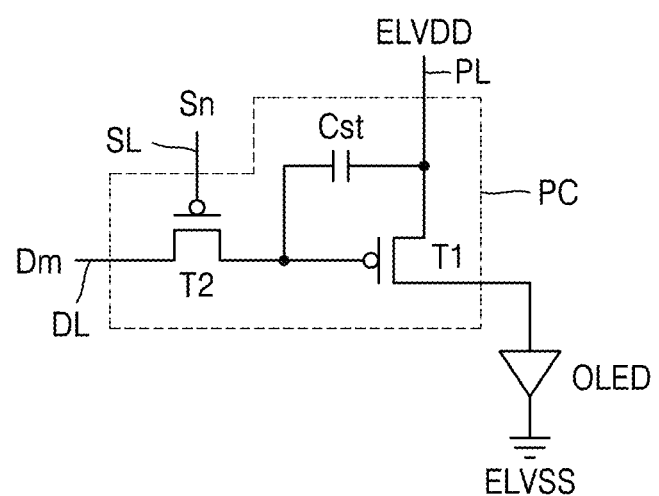
FIG. 3B is an equivalent circuit diagram of a pixel circuit electrically connected to an organic light-emitting diode included in the display panel of FIG. 3A according to an embodiment.

FIG. 3B is an equivalent circuit diagram of a pixel circuit electrically connected to an organic light-emitting diode included in the display panel of FIG. 3A.

Referring to FIG. 3B, the organic light-emitting diode OLED is electrically connected to a pixel circuit PC. The pixel circuit PC may include a first thin film transistor T1, a second thin film transistor T2, and a storage capacitor Cst.

The second thin film transistor T2 serves as a switching thin film transistor, may be connected to a scan line SL and a data line DL, and may transfer a data voltage (or a data signal Dm) input from the data line DL to the first thin film transistor T1 based on a switching voltage (or a switching signal Sn) input from the scan line SL. The storage capacitor Cst is connected to the second thin film transistor T2 and a driving voltage line PL and may store a voltage corresponding to a difference between a voltage transferred from the second thin film transistor T2 and a first power voltage ELVDD supplied to the driving voltage line PL.

The first thin film transistor T1 serves as a driving thin film transistor, may be connected to the driving voltage line PL and the storage capacitor Cst, and may control a driving current flowing through the organic light-emitting diode OLED from the driving voltage line PL according to the voltage stored in the storage capacitor Cst. The organic light-emitting diode OLED may emit light having preset brightness based on the driving current. A second electrode (e.g., a cathode) of the organic light-emitting diode OLED may receive a second power voltage ELVSS.

Though it is described in FIG. 3B that the pixel circuit PC includes two thin film transistors and one storage capacitor, the embodiment according to the invention is not limited thereto. The number of thin film transistors and the number of storage capacitors may be variously changed depending on the design of the pixel circuit PC. As an example, the pixel circuit PC may include three, four, five, or more thin film transistors.

Figure 4:
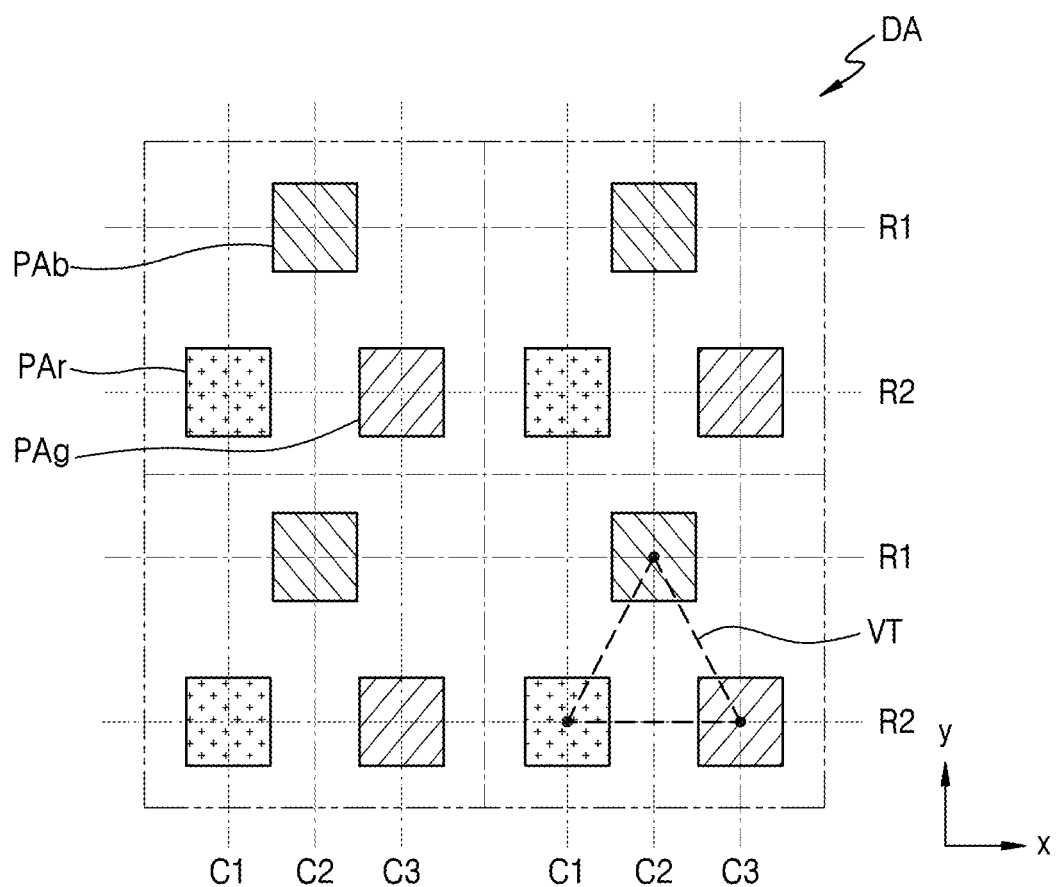
FIG. 4 is a plan view of a portion of a display area of a display apparatus according to an embodiment.

FIG. 4 is a plan view of a portion of a display area of a display apparatus according to an embodiment.

Referring to FIG. 4, the display apparatus includes an array of pixels arranged in the display area DA. The array of the pixels may include blue pixels PAb, red pixels PAr, and green pixels PAg arranged two-dimensionally. In an embodiment, the array of the pixels may have a configuration in which a minimal repeating unit is repeatedly arranged in an x-direction and a y-direction. The minimal repeating unit includes one blue pixel PAb, one red pixel PAr, and one green pixel PAg. The minimal repeating unit is a repeating unit having the smallest number of pixels (e.g., three pixels). The centers of a blue pixel PAb, a red pixel PAr, and a green pixel PAg included in the minimal repeating unit may be located at the vertexes of a virtual triangle VT. In an embodiment, the above-mentioned virtual triangle VT may be an equilateral triangle.

The array of the pixels may have a two-dimensional configuration of the minimal repeating units and have different configurations in the x-direction and the y-direction.

The arrangement of the pixels in the x-direction shows that the array of the pixels may have a configuration in which two rows in the x-direction are repeatedly arranged. Blue pixels PAb may be arranged on a first row R1 in the x-direction, and red pixels PAr and green pixels PAg may be alternately arranged on a second row R2 which is parallel to the first row R1 and arranged in the x-direction. The array of the pixels may have a structure in which the first row R1 and the second row R2 each having the above-mentioned structure are repeatedly arranged.

The arrangement of the pixels in the y-direction shows that pixels emitting light having the same color may be arranged on each column in the y-direction. Red pixels PAr may be arranged on a first column C1, blue pixels PAb may be arranged on a second column C2, and green pixels PAg may be arranged on a third column C3. The array of the pixels may have a structure in which the first column C1, the second column C2, and the third column C3 are repeatedly arranged.

Figure 5A:
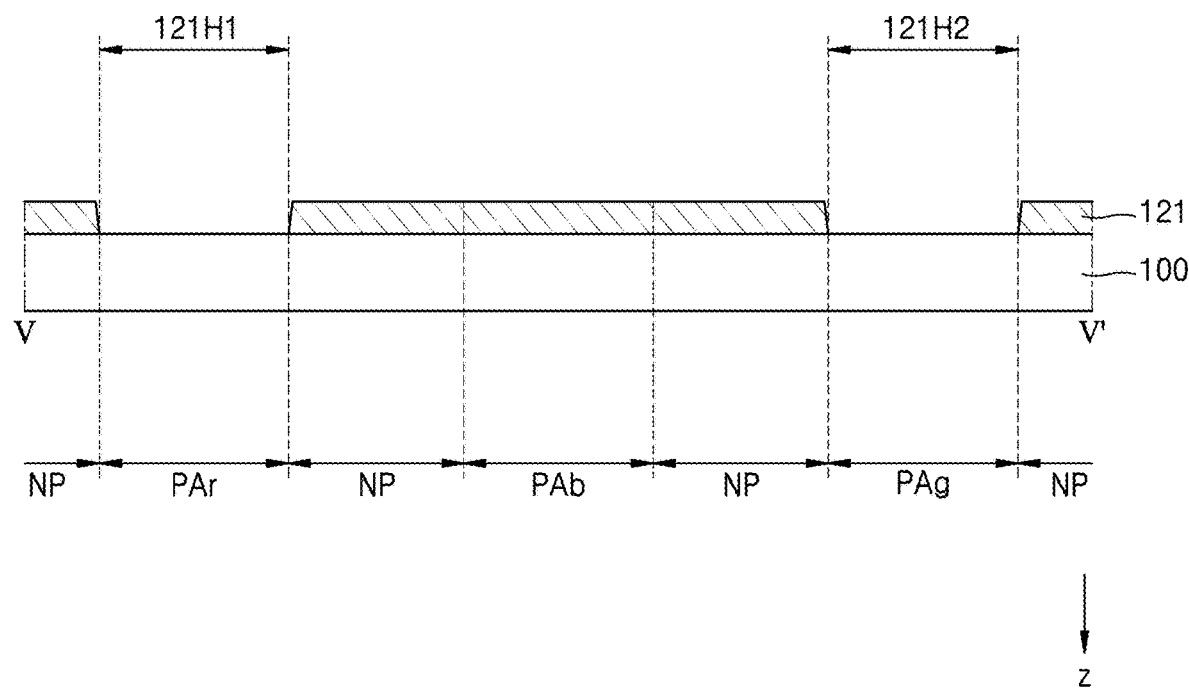
FIG. 5A is a cross-sectional view showing a process of manufacturing an optical panel according to an embodiment.
Figure 5B:
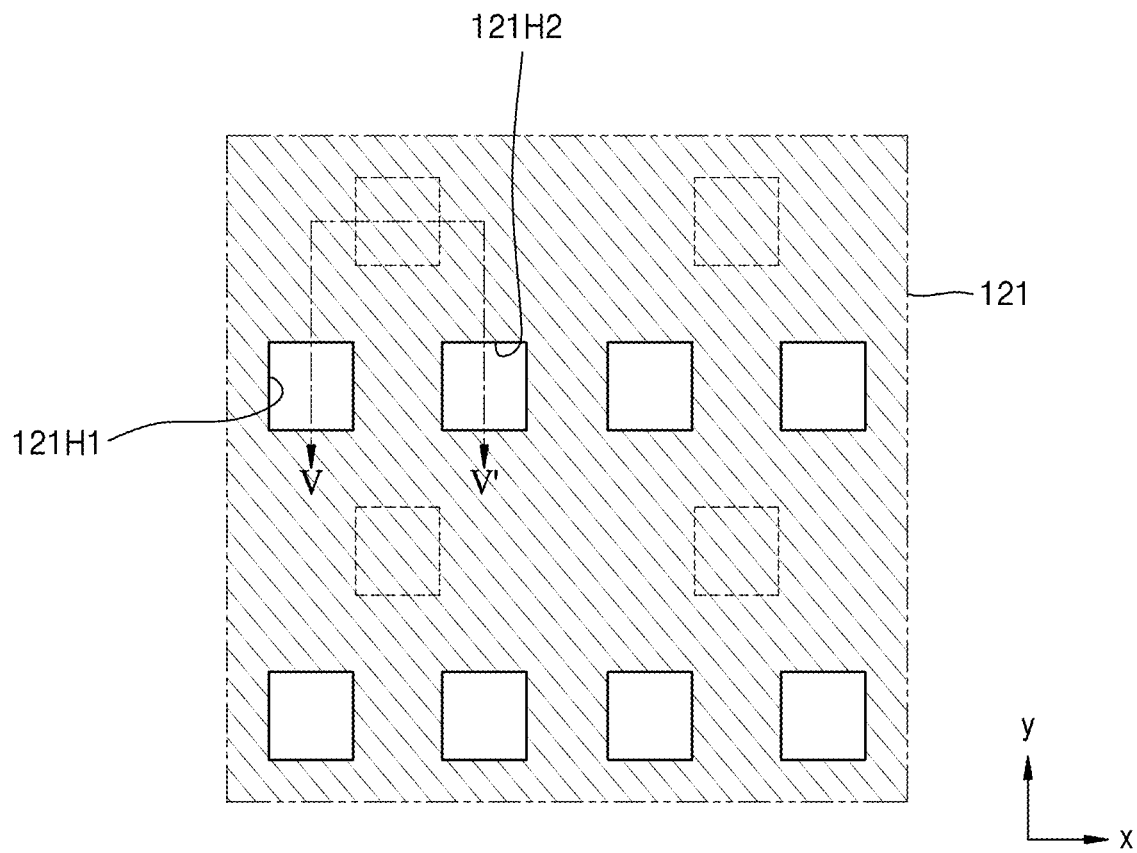
FIG. 5B is a plan view of a first color filter of an optical panel according to an embodiment.

FIG. 5A is a cross-sectional view showing a process of manufacturing an optical panel according to an embodiment, and FIG. 5B is a plan view of a first color filter 121 of an optical panel according to an embodiment. FIG. 5A corresponds to a cross-sectional view of the first color filter taken along line V-V of FIG. 5B.

Referring to FIGS. 5A and 5B, the first color filter 121 is formed on the first substrate 100.

The first color filter 121 may include a photosensitive material including blue pigment or dye. The first color filter 121 may be formed by coating the entirety of the photosensitive material on the first substrate 100 and then performing an exposure and developing process.

The first color filter 121 is formed on the first substrate 100 but is not formed on regions corresponding to the first pixel and the third pixel, for example, the red pixel PAr and the green pixel PAg. The first color filter 121 may define a first hole 121H1 and a second hole 121H2 corresponding to the red pixel PAr and the green pixel Pag, respectively. The first color filter 121 may define the first holes 121H1 and the second holes 121H2 that are repeatedly arranged. In an embodiment, the first color filter 121 may cover the entirety of the display area of the first substrate 100 except for portions corresponding to the first holes 121H1 and the second holes 121H2. The first color filter 121 may be formed also in the non-pixel areas NP between the pixels.

Figure 6A:
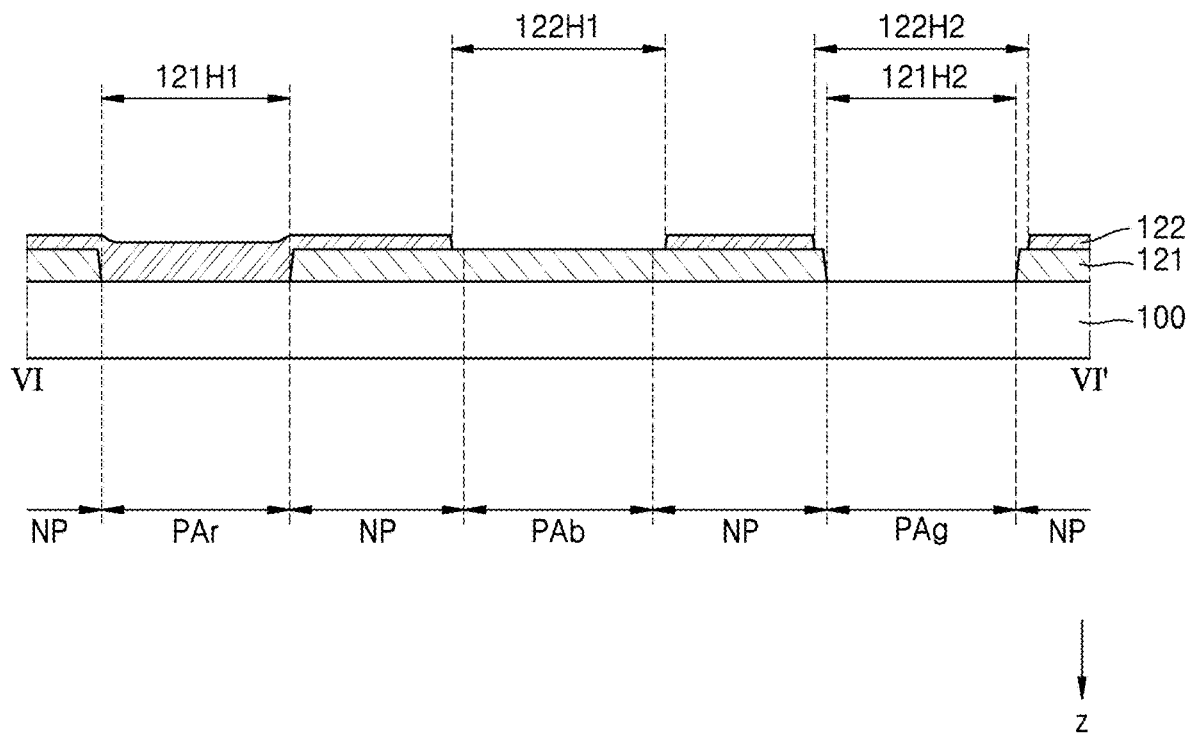
FIG. 6A is a cross-sectional view showing a process of manufacturing an optical panel according to an embodiment.
Figure 6B:
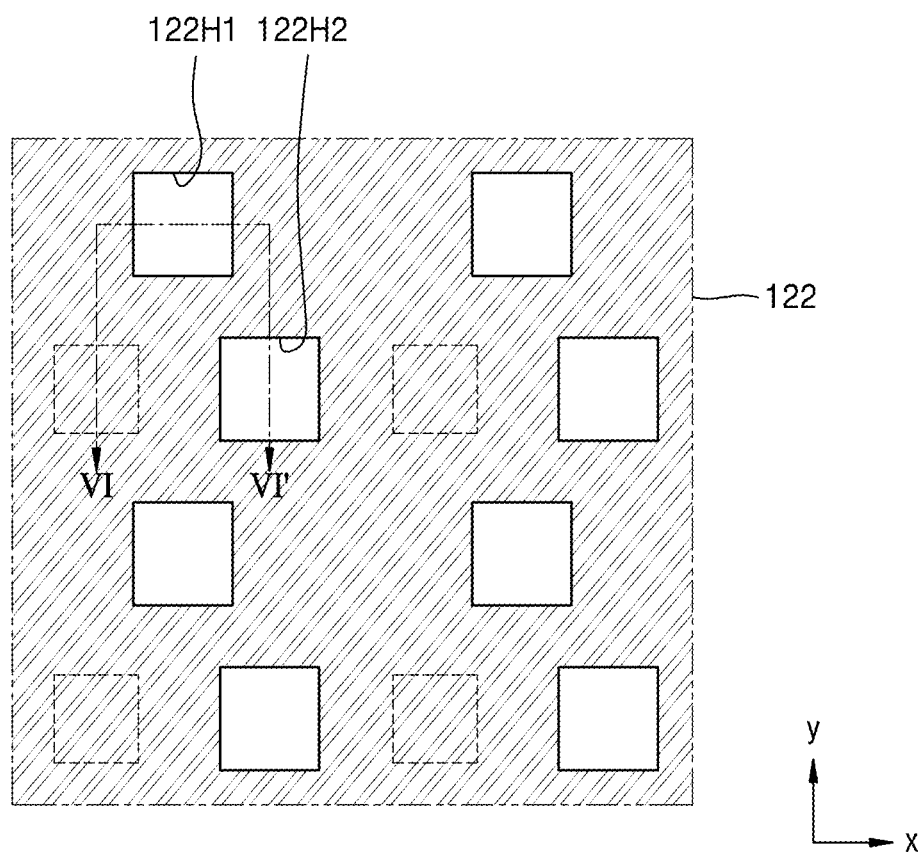
FIG. 6B is a plan view of a second color filter of an optical panel according to an embodiment.

FIG. 6A is a cross-sectional view showing a process of manufacturing an optical panel according to an embodiment, and FIG. 6B is a plan view of a second color filter 122 of an optical panel according to an embodiment. FIG. 6A corresponds to a cross-sectional view of the second color filter taken along line VI-VI' of FIG. 6B.

Referring to FIGS. 6A and 6B, the second color filter 122 may be formed on the first color filter 121.

The second color filter 122 may include a photosensitive material including red pigment or dye. The second color filter 122 may be formed by coating the entirety of the photosensitive material on the first substrate 100 and then performing an exposure and developing process.

The second color filter 122 may be formed on the first substrate 100 on which the first color filter 121 is formed and may be formed in a region corresponding to the second pixel, for example, the red pixel PAr. There may be the second color filter 122 in the first hole 121H1 of the first color filter 121. The second color filter 122 may directly contact the lateral surfaces of the first color filter 121 defining the first hole 121H1.

The second color filter 122 is not formed in regions corresponding to the first pixel and the second pixel, for example, the blue pixel PAb and the green pixel PAg. The second color filter 122 may define a third hole 122H1 and a fourth hole 122H2 corresponding to the blue pixel PAb and the green pixel Pag, respectively. The width of the fourth hole 122H2 may be greater than the width of the second hole 121H2 in the x,y direction.

The second color filter 122 may include the third hole 122H1 and the fourth hole 122H2 that are repeatedly arranged. In an embodiment, the second color filter 122 may cover the entirety of the display area of the first substrate 100 except for portions corresponding to the third holes 122H1 and the fourth holes 122H2. The second color filter 122 may be formed also in the non-pixel areas NP between the pixels. In the non-pixel area NP, a portion of the second color filter 122 may overlap a portion of the first color filter 121.

Figure 7A:
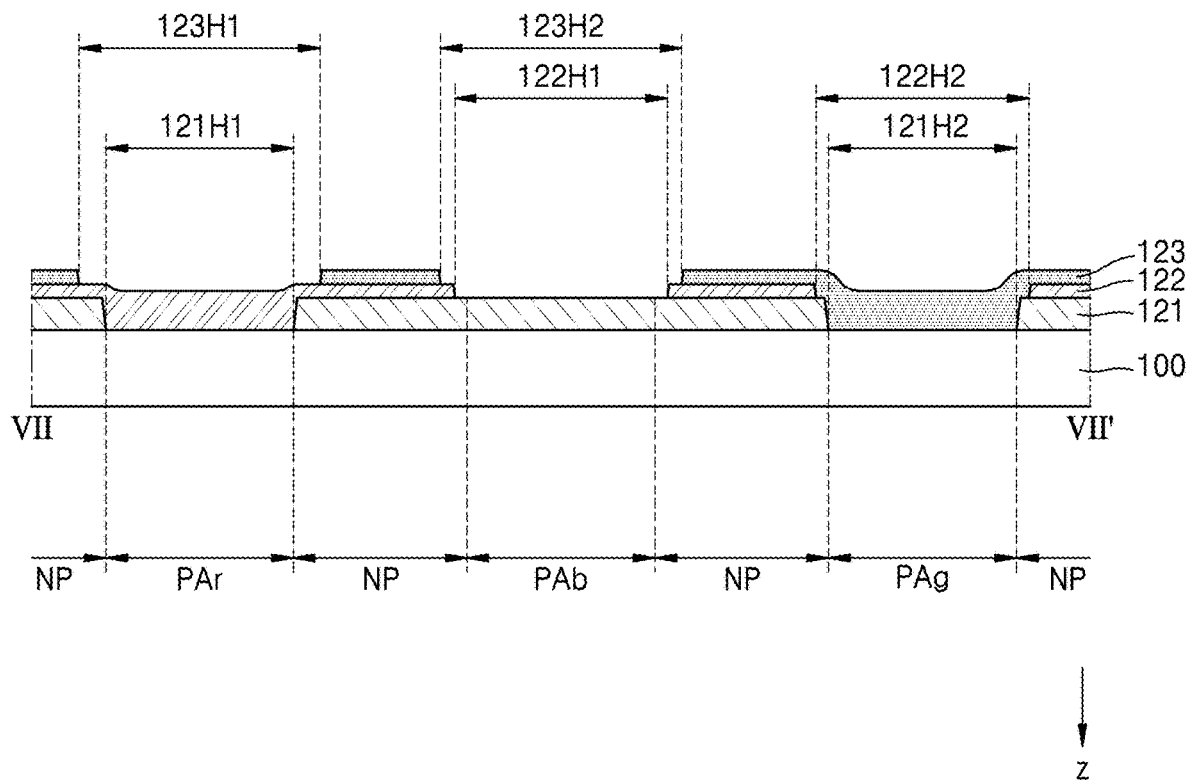
FIG. 7A is a cross-sectional view showing a process of manufacturing an optical panel according to an embodiment.
Figure 7B:
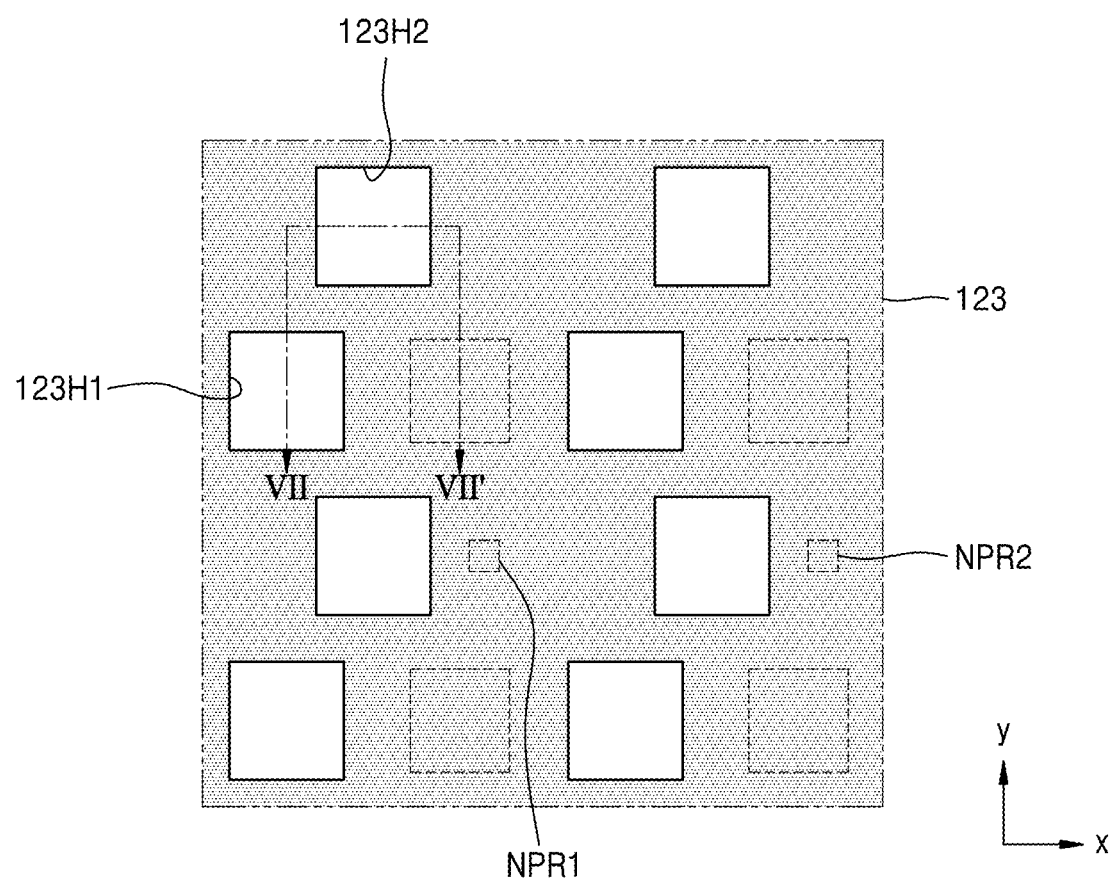
FIG. 7B is a plan view of a third color filter of an optical panel according to an embodiment.

FIG. 7A is a cross-sectional view showing a process of manufacturing an optical panel according to an embodiment, and FIG. 7B is a plan view of a third color filter 123 of an optical panel according to an embodiment. FIG. 7A corresponds to a cross-sectional view of the third color filter taken along line VII-VII' of FIG. 7B.

Referring to FIGS. 7A and 7B, the third color filter 123 may be formed on the second color filter 122.

The third color filter 123 may include a photosensitive material including red pigment or dye. The third color filter 123 may be formed by coating the entirety of the photosensitive material on the first substrate 100 and then performing an exposure and developing process.

The third color filter 123 may be formed on the first substrate 100 and may be formed in a region corresponding to the third pixel, for example, the green pixel PAg. There may be the third color filter 123 in the second hole 121H2 of the first color filter 121. The third color filter 123 may directly contact the lateral surfaces of the first color filter 121 defining the second hole 121H2.

Since the fourth hole 122H2 of the second color filter 122 overlaps the second hole 121H2 of the first color filter 121, the third color filter 123 may directly contact the lateral surfaces of the second color filter 122 defining the fourth hole 122H2.

The third color filter 123 is not formed in regions corresponding to the second pixel and the first pixel, for example, the red pixel PAr and the blue pixel PAb. The third color filter 123 may define a fifth hole 123H1 and a sixth hole 123H2 corresponding to the red pixel PAr and the blue pixel PAb, respectively. The width of the fifth hole 123H1 in the x,y direction may be greater than the width of the first hole 121H1 of the first color filter 121, and the width of the sixth hole 123H2 in the x,y direction may be greater than the width of the third hole 122H1 of the second color filter 122.

The third color filter 123 may include the fifth hole 123H1 and the sixth hole 123H2 that are repeatedly arranged. In an embodiment, the third color filter 123 may cover the entirety of the display area of the first substrate 100 except for portions corresponding to the fifth holes 123H1 and the sixth holes 123H2. The third color filter 123 may be formed also in the non-pixel areas NP between the pixels. In the non-pixel area NP, a portion of the third color filter 123 may overlap portions of the first color filter 121 and the second color filter 122.

Though it is shown in FIGS. 6A to 7B that the first color filter 121 is formed, and then the second color filter 122 and the third color filter 123 are formed, the embodiment according to the invention is not limited thereto. In another embodiment, the forming order of the second color filter 122 and the third color filter 123 may be changed. In this case, the structure described with reference to FIGS. 6A and 6B may correspond to the characteristics of a color filter including green pigment or dye, and the structure described with reference to FIGS. 7A and 7B may correspond to the characteristics of a color filter including red pigment or dye.

As described with reference to FIGS. 5A to 7B, the non-pixel area NP may have a structure, as a whole, in which color filters having different colors are stacked in at least two layers, for example, three layers. The fact that the non-pixel area NP has the stack structure of the color filters may mean that the stacking orders and/or the number of layers of the color filters at any two points selected in the non-pixel area NP are the same. As an example, the stacking order of the color filters and the number of layers of the color filters at a first point NPR1 and a second point NPR2 arbitrarily selected in the non-pixel area NP of FIG. 7B may be the same as the stacking order of the color filters and the number of layers of the color filters in the non-pixel area NP described with reference to FIG. 7A.

As a comparative example, color filters may be formed as follows. As an example, the first color filter 121 is formed and then the second color filter 122 may be formed to overlap the first color filter 121 in a portion of the non-pixel area NP, and the third color filter 123 may be formed to overlap the first color filter 121 in another portion of the non-pixel area NP. That is, the stacking orders of the color filters at any two points selected in the non-pixel area NP may be different from each other. In the comparative example having the above-described structure, a process error may occur to the first color filter 121 and the third color filter 123. An overlapping deviation of the color filters corresponding to the process error may be viewed as staining to a user. In contrast, according to an embodiment, since the structures of the color filters at the first point NPR1 and the second point NPR2 arbitrarily selected in the non-pixel area NP are the same, the issue in which staining corresponding to the process error is viewed to a user may be prevented or reduced.

Figure 8A:
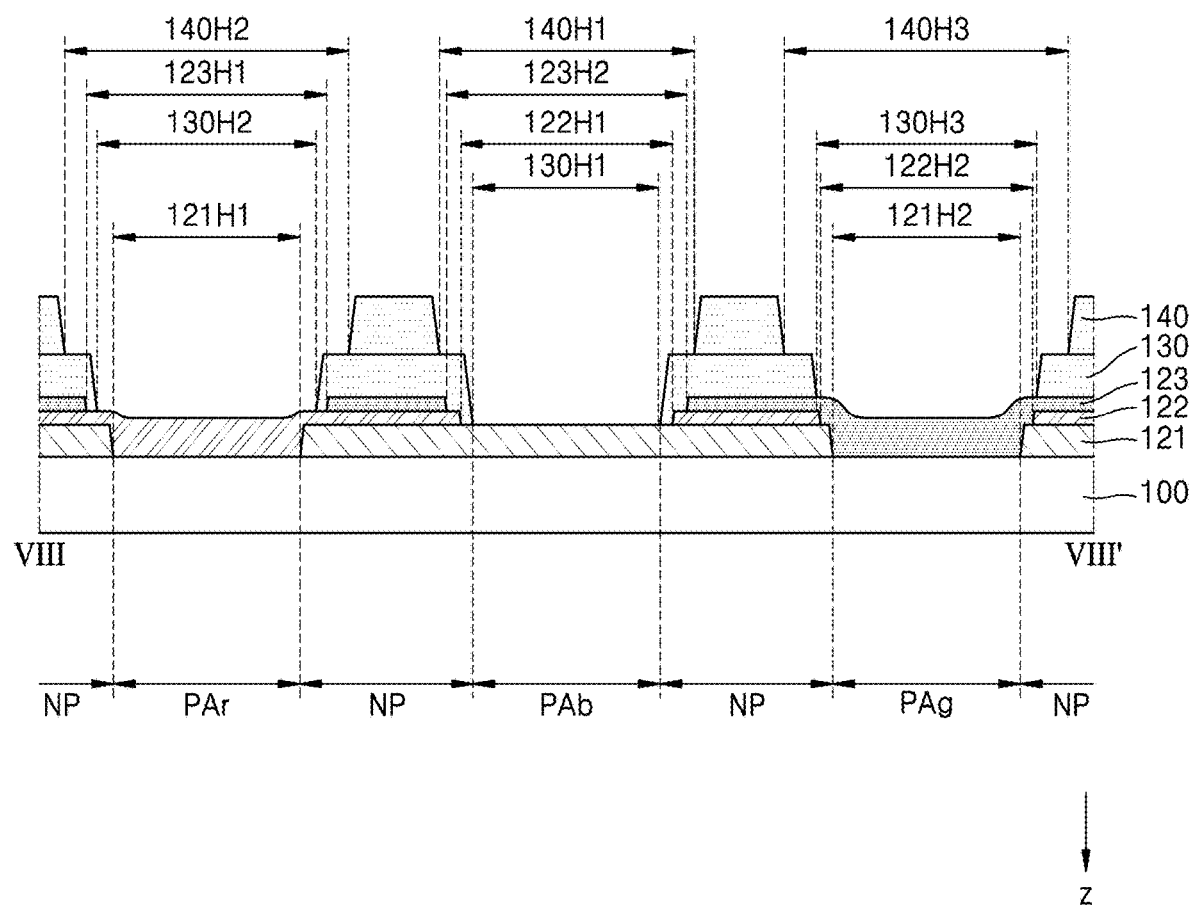
FIG. 8A is a cross-sectional view showing a process of manufacturing an optical panel according to an embodiment.
Figure 8B:
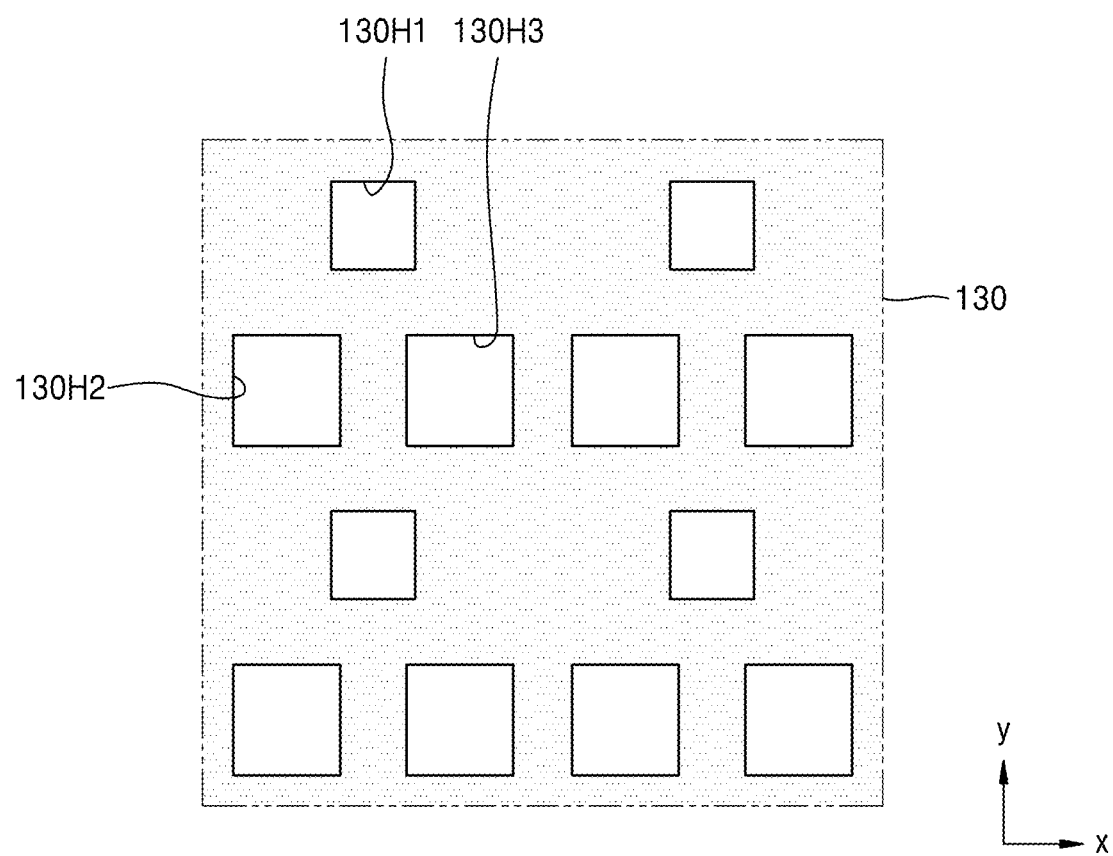
FIG. 8B is a plan view of a first light-blocking layer of an optical panel according to an embodiment.
Figure 8C:
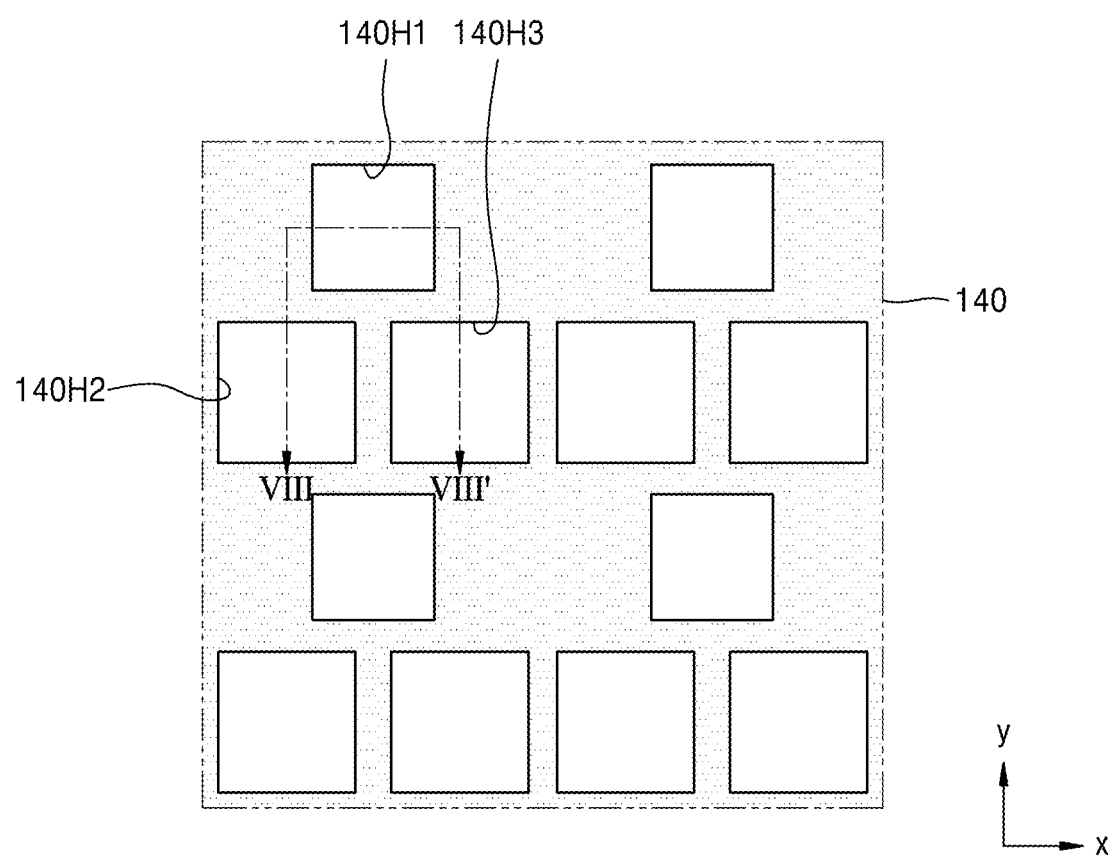
FIG. 8C is a plan view of a second light-blocking layer of an optical panel according to an embodiment.

FIG. 8A is a cross-sectional view showing a process of manufacturing an optical panel according to an embodiment, FIG. 8B is a plan view of the first light-blocking layer 130 of an optical panel according to an embodiment, and FIG. 8C is a plan view of the second light-blocking layer 140 of an optical panel according to an embodiment that is formed on the first light-blocking layer 130. FIG. 8A corresponds to a cross-sectional view taken along line VIII-VIII' of FIG. 8C.

Referring to FIGS. 8A to 8C, the first light-blocking layer 130 and the second light-blocking layer 140 may be sequentially formed on the first substrate 100 on which the color filters, for example, the first to third color filters 121, 122, and 123 are formed. The first light-blocking layer 130 and the second light-blocking layer 140 each may include a colored photosensitive material and a specific material thereof is the same as that described above. The first light-blocking layer 130 and the second light-blocking layer 140 may be formed through an exposure and developing process. Alternatively, the first light-blocking layer 130 and the second light-blocking layer 140 may be formed through a deposition process.

The first light-blocking layer 130 may be arranged to cover the non-pixel area NP over the first substrate 100. The first light-blocking layer 130 may define a seventh hole 130H1, an eighth hole 130H2, and a ninth hole 130H3 corresponding to the blue pixel PAb, the red pixel PAr, and the green pixel Pag, respectively.

The width of the seventh hole 130H1 in an x,y direction may be less than each of the widths of the third hole 122H1 of the second color filter 122 and the sixth hole 123H2 of the third color filter 123. The width of the blue pixel PAb of the display apparatus in an x,y direction may be defined by the width of the seventh hole 130H1.

The width of the eighth hole 130H2 in an x,y direction may be greater than the width of the first hole 121H1 of the first color filter 121. The width of the red pixel PAr of the display apparatus in an x,y direction may be defined by the width of the first hole 121H1 of the first color filter 121.

The width of the eighth hole 130H2 in an x,y direction may be less than the width of the fifth hole 123H1 of the third color filter 123. Alternatively, the width of the eighth hole 130H2 in an x,y direction may be equal to or greater than the width of the fifth hole 123H1 of the third color filter 123.

The width of the ninth hole 130H3 in an x,y direction may be greater than the width of the second hole 121H2 of the first color filter 121. The width of the green pixel PAg of the display apparatus in an x,y direction may be defined by the width of the second hole 121H2 of the first color filter 121.

The width of the ninth hole 130H3 in an x,y direction may be greater than the width of the fourth hole 122H2 of the second color filter 122. Alternatively, the width of the ninth hole 130H3 in an x,y direction may be equal to or less than the width of the fourth hole 122H2 of the second color filter 122.

The second light-blocking layer 140 may be arranged on the first light-blocking layer 130 to cover the non-pixel area NP over the first substrate 100. A partition wall having a sufficient height may be formed in the non-pixel area NP through the two-layered structure of the first light-blocking layer 130 and the second light-blocking layer 140. Sufficient areas and volumes of the color-converting layers and the transmission layer that are to be formed during a process described below may be secured through the relevant partition wall.

The second light-blocking layer 140 may define a tenth hole 140H1, an eleventh hole 140H2, and a twelfth hole 140H3 corresponding to the blue pixel PAb, the red pixel PAr, and the green pixel Pag, respectively. Each of the tenth hole 140H1, the eleventh hole 140H2, and the twelfth hole 140H3 may be greater than each of the sizes of the seventh hole 130H1, the eighth hole 130H2, and the ninth hole 130H3 of the first light-blocking layer 130. The width of the tenth hole 140H1 in an x,y direction may be greater than the width of the seventh hole 130H1, the width of the eleventh hole 140H2 in an x,y direction may be greater than the width of the eighth hole 130H2, and the width of the twelfth hole 140H3 in an x,y direction may be greater than the width of the ninth hole 130H3.

The width of the tenth hole 140H1 in an x,y direction may be equal to, greater than, or less than each of the third hole 122H1 of the second color filter 122 and the sixth hole 123H2 of the third color filter 123.

The width of the eleventh hole 140H2 in an x,y direction may be greater than the width of the fifth hole 123H1 of the third color filter 123. Alternatively, the width of the eleventh hole 140H2 in an x,y direction may be equal to or less than the width of the fifth hole 123H1 of the third color filter 123. That is, the width of the fifth hole 123H1 of the third color filter 123 in an x,y direction may be equal to or greater than the width of the eleventh hole 140H2.

The width of the twelfth hole 140H3 in an x,y direction may be greater than the width of the fourth hole 122H2 of the second color filter 122. Alternatively, the width of the twelfth hole 140H3 in an x,y direction may be equal to or less than the width of the fourth hole 122H2 of the second color filter 122.

Figure 9A:
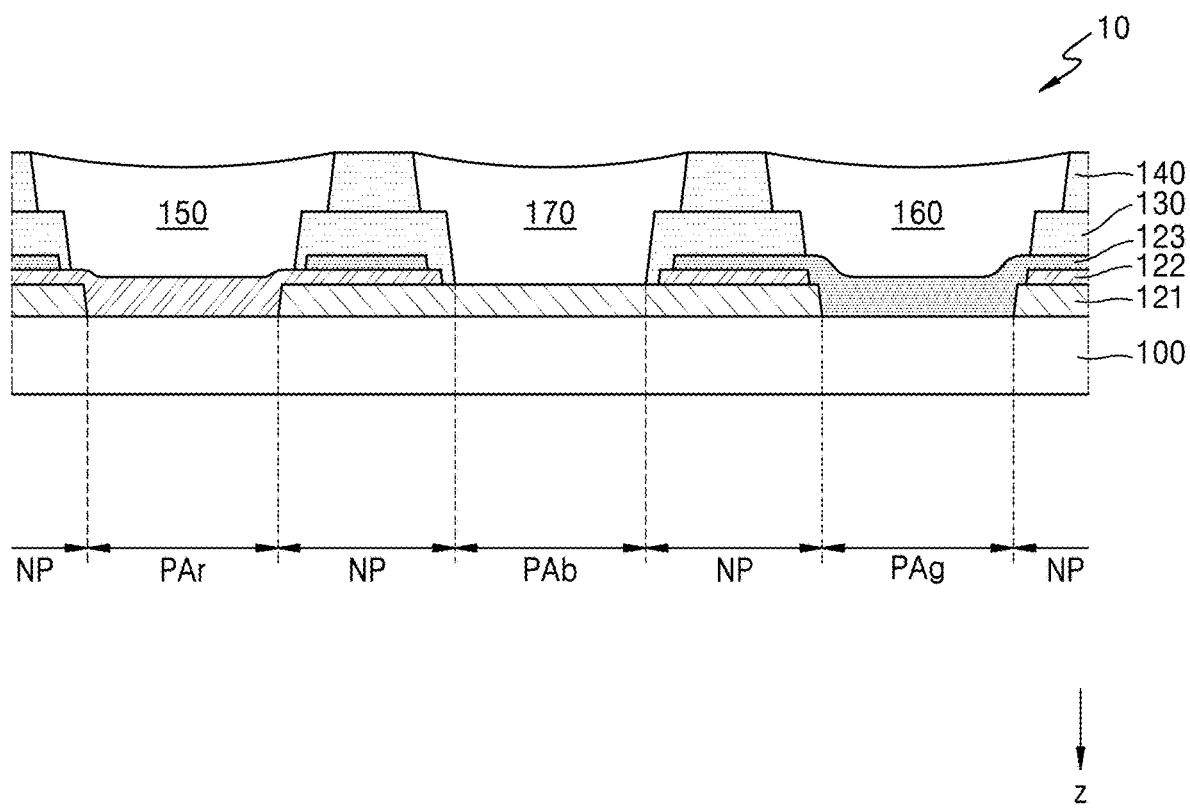
FIGS. 9A and 9B are cross-sectional views showing a process of manufacturing an optical panel according to an embodiment.
Figure 9B:
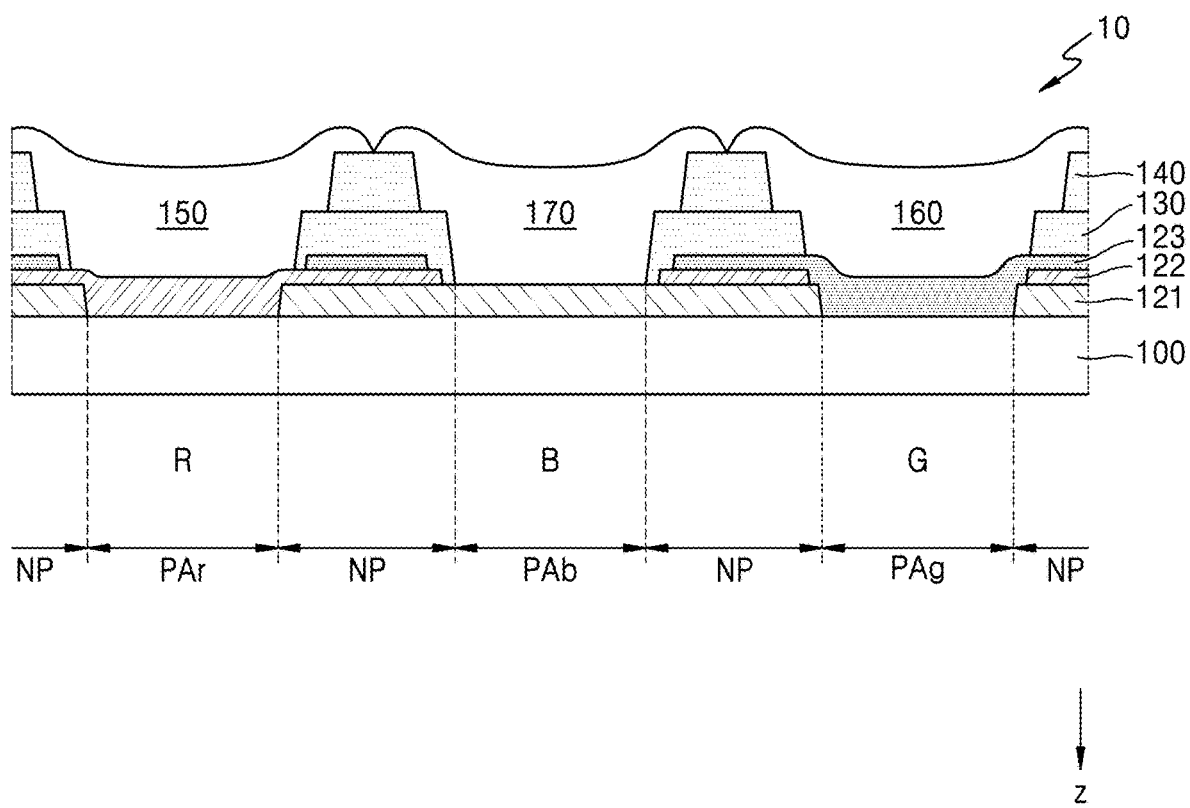

FIGS. 9A and 9B are cross-sectional views showing a process of manufacturing an optical panel according to an embodiment.

Referring to FIGS. 9A and 9B, the first color-converting layer 150, the second color-converting layer 160, and the transmission layer 170 may be disposed to correspond to each pixel. The materials of the first color-converting layer 150, the second color-converting layer 160, and the transmission layer 170 are the same as those described above. The first color-converting layer 150, the second color-converting layer 160, and the transmission layer 170 may be formed through an inkjet or photo-etching process.

In an embodiment, as shown in FIG. 9A, the first color-converting layer 150, the second color-converting layer 160, and the transmission layer 170 may be arranged in a space defined by the partition walls of the first light-blocking layer 130 and the second light-blocking layer 140. The material constituting the first color-converting layer 150, the second color-converting layer 160, and the transmission layer 170 may not extend to the top surface of the partition walls, for example, the top surface of the second light-blocking layer 140. A surface of each of the first color-converting layer 150, the second color-converting layer 160, and the transmission layer 170 that is away from the first substrate 100 may have a concave shape. That is, in FIGS. 9A and 9B, an upper surface of each of the first color-converting layer 150, the second color-converting layer 160, and the transmission layer 170 may have a concave shape. As an example, each of the first color-converting layer 150, the second color-converting layer 160, and the transmission layer 170 may have a thickness of a central portion less than a thickness of an edge portion.

In another embodiment, as shown in FIG. 9B, the first color-converting layer 150, the second color-converting layer 160, and the transmission layer 170 may be arranged in the space defined by the partition walls of the first light-blocking layer 130 and the second light-blocking layer 140, and a portion of the first color-converting layer 150, the second color-converting layer 160, and the transmission layer 170 may extend over the top surface of the partition walls. As an example, the edge of each of the first color-converting layer 150, the second color-converting layer 160, and the transmission layer 170 may be located on the top surface of the second light-blocking layer 140. In an embodiment, an edge portion of each of the first color-converting layer 150, the second color-converting layer 160, and the transmission layer 170 may have a convex shape (see FIG. 9B). Neighboring layers among the first color-converting layer 150, the second color-converting layer 160, and the transmission layer 170 may contact each other or at least partially overlap each other in the non-pixel area NP.

The barrier layer 180 described above with reference to FIG. 2A may or may not be further provided on the optical panel 10 shown in FIG. 9B.

Though the optical panel described with reference to FIGS. 5A to 9B has the structure in which three color filters are stacked in the non-pixel area NP, the embodiment according to the invention is not limited thereto. Two color filters may overlap each other in a region corresponding to the non-pixel area NP of the optical panel. As an example, after the process of forming the first color filter 121 described with reference to FIGS. 5A and 5B, and the process of forming the second color filter 122 described with reference to FIGS. 6A and 6B, the third color filter 123 shown in FIGS. 10A and 10B may be formed instead of the process described with reference to FIGS. 7A and 7B.

Figure 10A:
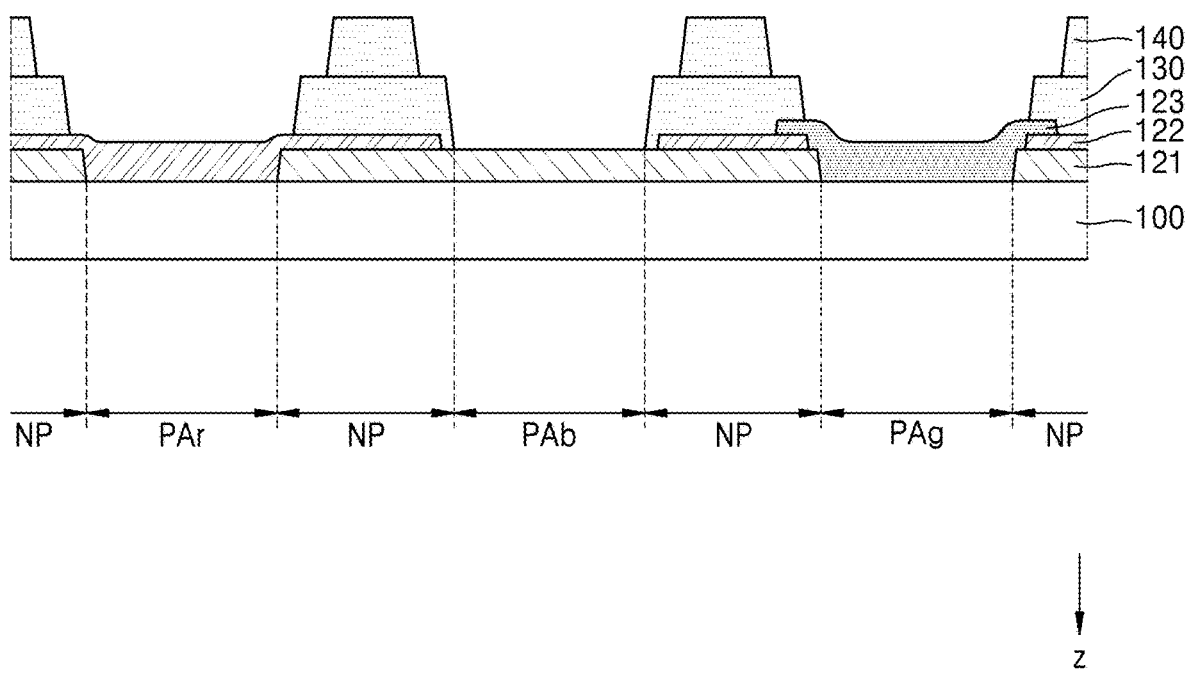
FIG. 10A is a cross-sectional view showing a process of manufacturing an optical panel according to another embodiment.
Figure 10B:
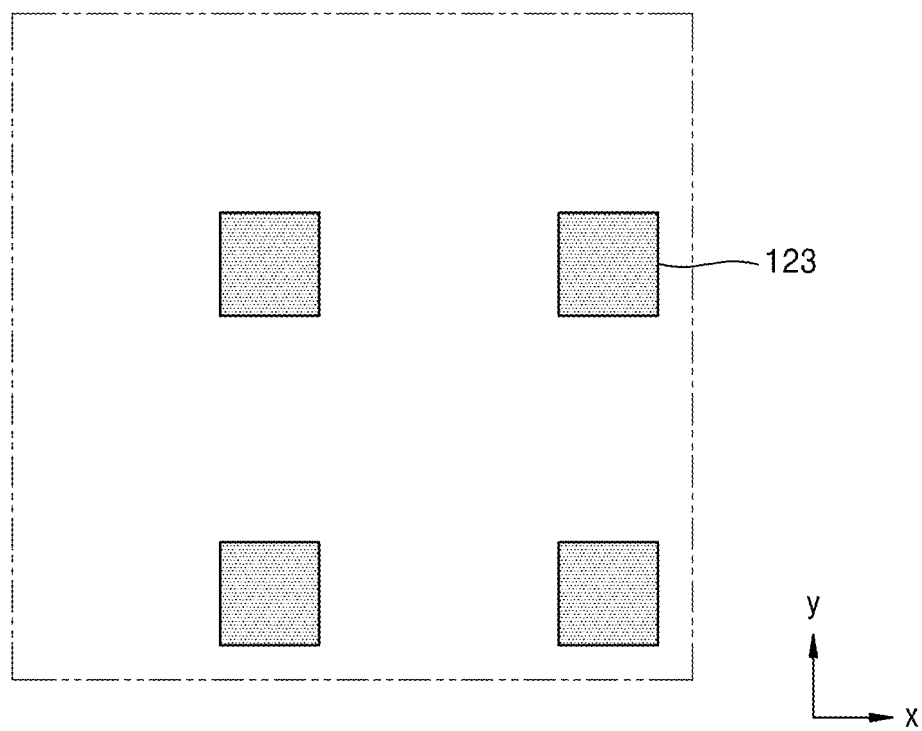
FIG. 10B is a plan view of a third color filter of an optical panel according to another embodiment.

FIG. 10A is a cross-sectional view showing a process of manufacturing an optical panel according to another embodiment, and FIG. 10B is a plan view of the third color filter 123 of an optical panel according to another embodiment.

Referring to FIGS. 10A and 10B, the third color filter 123 may be formed on the first substrate 100 on which the first color filter 121 and the second color filter 122 are formed.

The third color filter 123 may have an island type (or isolated type) pattern corresponding to a relevant pixel, for example, a green pixel Pag. As an example, as shown in FIG. 10B, the third color filters 123 apart from each other may be arranged on the first substrate 100.

The process of forming the first light-blocking layer 130 and the second light-blocking layer 140 after forming the third color filter 123 is the same as that described above with reference to FIGS. 8A to 8C. Other characteristics except that the third color filter 123 is covered by the first light-blocking layer 130 may be the same as those described above.

Figure 11A:
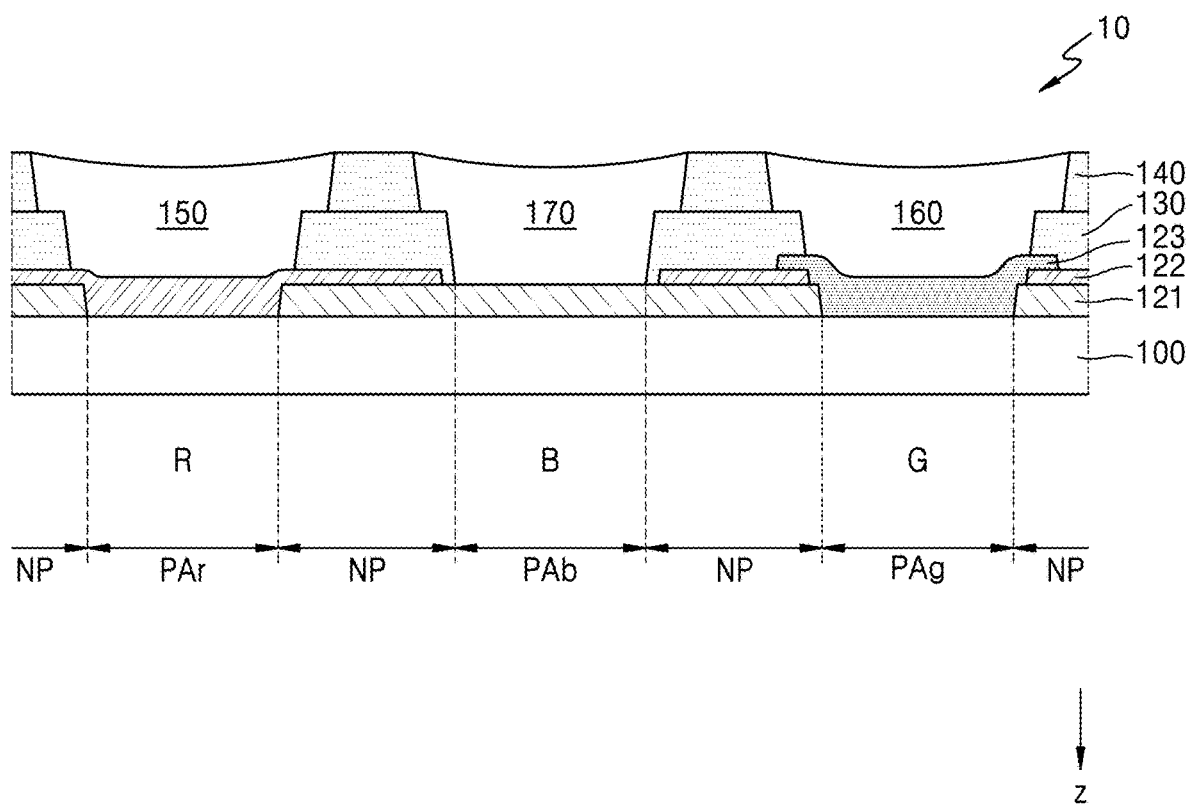
FIGS. 11A and 11B are cross-sectional views showing a process of manufacturing an optical panel according to an embodiment.
Figure 11B:
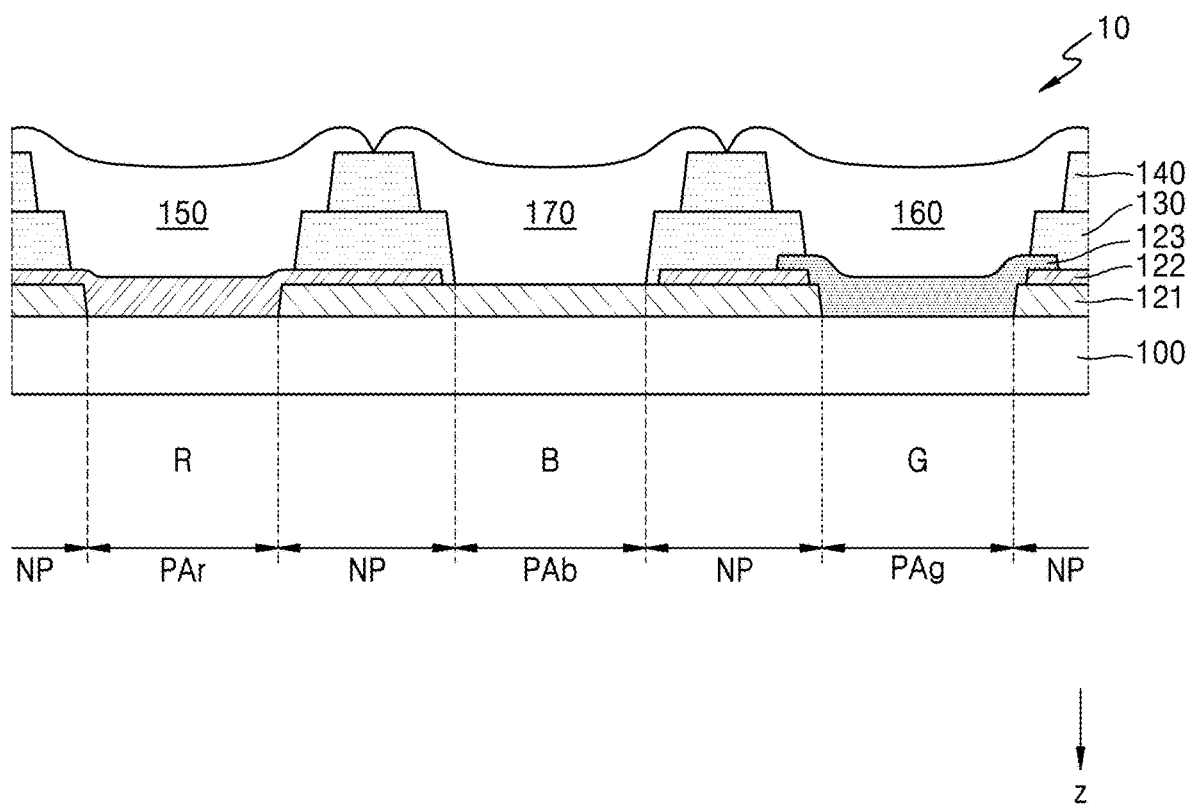

FIGS. 11A and 11B are cross-sectional views showing a process of manufacturing an optical panel according to an embodiment.

Referring to FIGS. 11A and 11B, the first color-converting layer 150, the second color-converting layer 160, and the transmission layer 170 may be disposed to correspond to each pixel. The first color-converting layer 150, the second color-converting layer 160, and the transmission layer 170 may be formed through an inkjet process. Accordingly, as shown in FIG. 11A, the first color-converting layer 150, the second color-converting layer 160, and the transmission layer 170 may be apart from each other and formed in the space defined by the partition walls of the first light-blocking layer 130 and the second light-blocking layer 140.

The first color-converting layer 150, the second color-converting layer 160, and the transmission layer 170 may be formed through a photo-etching process. As shown in FIG. 11B, the first color-converting layer 150, the second color-converting layer 160, and the transmission layer 170 may contact or overlap each other and be arranged in the space defined by the partition walls of the first light-blocking layer 130 and the second light-blocking layer 140.

A display apparatus according to embodiments may prevent deterioration of display quality due to voltage drop of a second electrode in the display apparatus having a large display area. In addition, since the display apparatus includes color elements arranged to have a preset rule, a process of manufacturing a color-converting portion included in a color panel may be efficiently performed, and display elements and pixel circuits electrically connected to the display elements may be efficiently arranged in a preset space. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus for providing an image through an array of a plurality of pixels apart from each other with a non-pixel area therebetween, the display apparatus comprising:

a light-emitting panel which emits light of a single color; and an optical panel which converts the light emitted from the light-emitting panel into light of another color or transmits the light of the light-emitting panel,
wherein the optical panel includes:
a substrate;
a plurality of color filters arranged over the substrate;
a first light-blocking layer arranged in the non-pixel area;
a second light-blocking layer arranged in the non-pixel area and on the first light-blocking layer; and
a color-converting layer and a transmission layer each overlapping a corresponding color filter among the plurality of color filters in a plan view,
wherein
each of the first light-blocking layer and the second light-blocking layer defines a plurality of holes corresponding to the plurality of pixels, and a width of a hole of the second light-blocking layer among the plurality of holes is greater than a width of a hole of the first light-blocking layer among the plurality of holes.

2. The display apparatus of claim 1, wherein the plurality of color filters includes a first color filter, a second color filter, and a third color filter having different colors from each other, and
two or more color filters of the first to third color filters extend to the non-pixel area, and extension portions of the two or more color filters are arranged between the substrate and the first light-blocking layer.

3. The display apparatus of claim 1, wherein the second light-blocking layer directly contacts the first light-blocking layer, and a stack body including the first light-blocking layer and the second light-blocking layer surround each of the plurality of pixels in the plan view.

4. The display apparatus of claim 3, wherein the color-converting layer is apart from the transmission layer with respect to the stack body in the plan view.

5. The display apparatus of claim 3, wherein the color-converting layer contacts the transmission layer on the stack body.

6. The display apparatus of claim 1, wherein the plurality of color filters includes:
a first color filter overlapping the transmission layer in the plan view;
a second color filter having a color different from the first color filter; and
a third color filter having a color different from each of the first color filter and the second color filter, and
the second color filter defines a first hole overlapping the transmission layer and a portion of the first color filter in the plan view,
wherein the first hole overlaps a second hole of the plurality of holes of the first light-blocking layer.

7. The display apparatus of claim 6, wherein a width of the second hole is less than a width of the first hole.

8. The display apparatus of claim 6, wherein the first color filter defines a third hole overlapping a portion of the second color filter in the plan view, the third hole overlaps a fourth hole of the plurality of holes of the first light-blocking layer in the plan view, and
a width of the fourth hole is greater than a width of the third hole.

9. The display apparatus of claim 1, wherein the light-emitting panel includes an organic light-emitting diode.

10. A display apparatus for providing an image through an array of a plurality of pixels including a first pixel, a second pixel, and a third pixel apart from one another with a non-pixel area therebetween, the display apparatus comprising:
a light-emitting panel including a light-emitting diode; and
an optical panel arranged on the light-emitting panel,
wherein the optical panel includes:
a substrate;
a filter layer arranged on the substrate and including a first color filter, a second color filter, and a third color filter corresponding to the first pixel, the second pixel, and the third pixel, respectively;
a stack body arranged in the non-pixel area and including a first light-blocking layer and a second light-blocking layer; and
a color-converting layer and a transmission layer each arranged in a corresponding pixel of the first to third pixels,
wherein each of the first light-blocking layer and the second light-blocking layer defines a plurality of holes corresponding to the plurality of pixels, and a width of a hole of the second light-blocking layer among the plurality of holes is different from a width of a hole of the first light-blocking layer among the plurality of holes.

11. The display apparatus of claim 10, wherein each of the first light-blocking layer and the second light-blocking layer includes a material having a color different from colors of the first to third color filters.

12. The display apparatus of claim 10, wherein the stack body includes a first portion and a second portion,
the second portion is farther from the substrate than the first portion, and a width of the first portion is greater than a width of the second portion.

13. The display apparatus of claim 12, wherein the first portion includes the first light-blocking layer, and the second portion includes the second light-blocking layer.

14. The display apparatus of claim 10, wherein two or more color filters of the first to third color filters extend to the non-pixel area, and extension portions of the two or more color filters are arranged between the substrate and the stack body.

15. The display apparatus of claim 10, wherein the color-converting layer is apart from the transmission layer with respect to the stack body in a plan view.

16. The display apparatus of claim 10, wherein the color-converting layer contacts the transmission layer on the stack body.

17. The display apparatus of claim 10, wherein the first color filter overlaps the transmission layer in the first pixel,
the second color filter defines a first hole located in the first pixel, the first hole overlaps a second hole of the plurality of holes of the first light-blocking layer, and
a width of the second hole is less than a width of the first hole.

18. The display apparatus of claim 10, wherein the color-converting layer includes a first color-converting layer including first quantum dots, and a second color-converting layer including second quantum dots,
the second color filter overlaps the first color-converting layer in the second pixel in a plan view,
the first color filter defines a third hole located in the second pixel, the third hole overlaps a fourth hole of the plurality of holes of the first light-blocking layer, and
a width of the fourth hole is greater than a width of the third hole.

19. The display apparatus of claim 18, wherein the first quantum dot includes a same material as the second quantum dot and has a size different from a size of the second quantum dot.

20. The display apparatus of claim 11, wherein the light-emitting panel includes an organic light-emitting diode.

* * * * *